(12) United States Patent
Cheng et al.

(10) Patent No.: US 7,395,473 B2
(45) Date of Patent: Jul. 1, 2008

(54) REMOVING THE EFFECTS OF UNKNOWN TEST VALUES FROM COMPACTED TEST RESPONSES

(76) Inventors: Wu-Tung Cheng, 19030 SW. 35th Pl., Lake Oswego, OR (US) 97034; Manish Sharma, 25780 SW. Canyon Creek Rd., C301, Wilsonville, OR (US) 97070

( * ) Notice: Subject to any disclaimer, the term of this patent is extended or adjusted under 35 U.S.C. 154(b) by 327 days.

(21) Appl. No.: 11/258,769

(22) Filed: Oct. 25, 2005

(65) Prior Publication Data
US 2006/0156144 A1 Jul. 13, 2006

Related U.S. Application Data

(60) Provisional application No. 60/634,878, filed on Dec. 10, 2004.

(51) Int. Cl.
*G01R 31/28* (2006.01)
(52) U.S. Cl. .................. 714/729; 714/727
(58) Field of Classification Search .......... 714/733, 714/726, 734, 724, 729, 727; 702/185
See application file for complete search history.

(56) References Cited

U.S. PATENT DOCUMENTS

| 6,463,561 | B1 * | 10/2002 | Bhawmik et al. ........... 714/733 |
| 6,557,129 | B1 | 4/2003 | Rajski et al. |
| 6,590,929 | B1 | 7/2003 | Williams |
| 6,829,740 | B2 | 12/2004 | Rajski et al. |
| 7,058,869 | B2 * | 6/2006 | Abdel-Hafez et al. ....... 714/729 |
| 7,185,253 | B2 * | 2/2007 | Mitra et al. ................. 714/734 |
| 7,222,277 | B2 * | 5/2007 | Wang et al. ................. 714/726 |
| 7,239,978 | B2 * | 7/2007 | Cheng et al. ................. 702/185 |
| 2003/0188269 | A1 | 10/2003 | Mitra et al. |
| 2004/0230884 | A1 | 11/2004 | Rajski et al. |
| 2005/0055613 | A1 | 3/2005 | Mitra et al. |

OTHER PUBLICATIONS

Barnhart et al., "OPMISR: The foundation for compressed ATPG vectors," *Proc. ITC*, pp. 748-757 (2001).
Bayraktaroglu et al., "Test volume and application time reduction through scan chain concealment" *Proc. IEEE Design Automation Conf.*, pp. 151-155 (2001).
Blahut, "Linear Block Codes," in *Algebraic Codes for Data Transmission*, Ch. 3, pp. 49-66 (2003).
Blahut, *Theory and Practice of Error Control Codes*, 7 pp. (May 1983).
Chakrabarty et al., "Test Response Compaction Using Multiplexed Parity Trees," *Proc. Trans. CAD*, vol. 15, No. 11, pp. 1399-1408 (Nov. 1996).

(Continued)

*Primary Examiner*—David Ton
(74) *Attorney, Agent, or Firm*—Klarquist Sparkman, LLP

(57) ABSTRACT

Methods, apparatus, and systems for filtering compacted test responses are disclosed. The methods, apparatus, and systems can be used, for example, to remove the effects of unknown test values. For instance, in one embodiment, a compacted test response from a compactor of a circuit-under-test is received. In this embodiment, the compacted test response includes one or more compacted test response values that are dependent on one or more respective unknown values. The compacted test response is filtered to remove the dependency of at least some of the compacted test response values on the one or more respective unknown values, and a filtered test response is output. Various filtering circuits and testing systems are also disclosed.

34 Claims, 16 Drawing Sheets

OTHER PUBLICATIONS

Chakrabarty, "Zero-aliasing space compaction using linear compactors with bounded overhead," *Proc. Trans. CAD*, vol. 17, pp. 452-457 (May 1998).

Chandra et al., "Frequency-Directed Run Length (FDR) Codes with Application to System-on-a-Chip Test Data Compression," *Proc. VLSI Test Symp.*, pp. 42-47 (2001).

Chickermane et al., "Channel Masking Synthesis for Efficient On-Chip Test Compression," *Proc. ITC*, pp. 452-461 (2004).

Hamzaoglu et al., "Reducing test application time for full scan embedded cores," *Proc. Int. Symp. Fault-Toler. Comput.*, pp. 260-267 (1999).

Jas et al., "Virtual Scan Chains: A Means for Reducing Scan Length in Cores," *Proc. VLSI Test Symp.*, pp. 73-78 (2000).

Koenemann et al., "A SmartBIST variant with guaranteed encoding," *Proc. IEEE Asian Test Symp.*, pp. 325-330 (2001).

Konemann et al., "Built-In Logic Block Observation Technique," *Proc. ITC*, pp. 37-41 (1979).

Krishna et al., "3-Stage Variable Length Continuous-Flow Scan Vector Decompression Scheme," *Proc. VLSI Test Symp.*, pp. 79-86 (2004).

Lumetta et al., "X-codes: Error control with unknowable inputs," *Proc. Int. Symp. Inform. Theory*, p. 102 (2003).

Mitra et al., "X-Compact: An Efficient Response Compaction Technique," *IEEE Trans. CAD*, vol. 23, Issue 3, pp. 421-432 (Mar. 2004).

Patel et al., "Application of Saluja-Karpovsky Compactors to Test Responses with Many Unknowns," *Proc. VLSI Test Symp.*, pp. 107-112 (2003).

Pouya et al., "Synthesis of Zero-Aliasing Space Elementary-Tree Space Compactors," *Proc. VLSI Test Symp.*, pp. 70-77 (1998).

Rajski et al., "Convolutional Compaction of Test Responses," *Proc. ITC*, pp. 745-754 (2003).

Rajski et al., "Embedded Deterministic Test for Low Cost Manufacturing Test," *Proc. ITC*, pp. 301-310 (2002).

Saluja et al., "Testing Computer Hardware Through Data Compression in Space and Time," *Proc. ITC*, pp. 83-89 (1983).

Sharma et al., "X-filter: Filtering unknowns from compacted test responses," *Proc. ITC*, 9 pp. (Nov. 8, 2005).

Sinanoglu et al., "Efficient Construction of Aliasing-Free Compaction Circuitry," *IEEE Micro*, vol. 22, Issue 5, pp. 82-92 (Sep.-Oct. 2002).

Sinanoglu et al., "Parity-Based Output Compaction for Core-Based SOCs," *Proc. European Test Workshop*, pp. 15-20 (2003).

Volkerink et al., "Packet-based Input Test Data Compression Techniques," *Proc. ITC*, pp. 154-163 (2002).

Wang et al., "On Compacting Test Response Data Containing Unknown Values," *Proc. Trans. CAD*, pp. 855-862 (2003).

Wohl et al., "Analysis and Design of Optimal Combinational Compactors," *Proc. VLSI Test Symp.*, pp. 101-106 (2003).

Wohl et al., "Efficient Compression and Application of Deterministic Patterns in a Logic BIST Architecture," *Proc. Design Automation Conf.*, pp. 566-569 (2003).

Wohl et al., "Scalable Selector Architecture for X-Tolerant Deterministic BIST," *Proc. Design Automation Conf.*, pp. 934-939 (2004).

\* cited by examiner

FIG. 6

$$\underset{\substack{H \\ (m \times n)}}{\overset{610 \searrow}{\begin{bmatrix} 1 & 1 & 1 & 1 & 1 & 1 & 1 & 1 \\ 1 & 0 & 1 & 1 & 0 & 0 & 1 & 0 \\ 1 & 1 & 0 & 1 & 0 & 1 & 0 & 0 \\ 1 & 1 & 1 & 1 & 0 & 0 & 0 & 0 \end{bmatrix}}} \bullet \underset{\substack{t \\ (n \times 1)}}{\overset{620 \searrow}{\begin{bmatrix} 1 \\ 0 \\ 1 \\ 0 \\ 0 \\ 0 \\ 1 \\ 0 \end{bmatrix}}} = \underset{\substack{s \\ (m \times 1)}}{\overset{630 \searrow}{\begin{bmatrix} 1 \\ 1 \\ 1 \\ 0 \end{bmatrix}}}$$

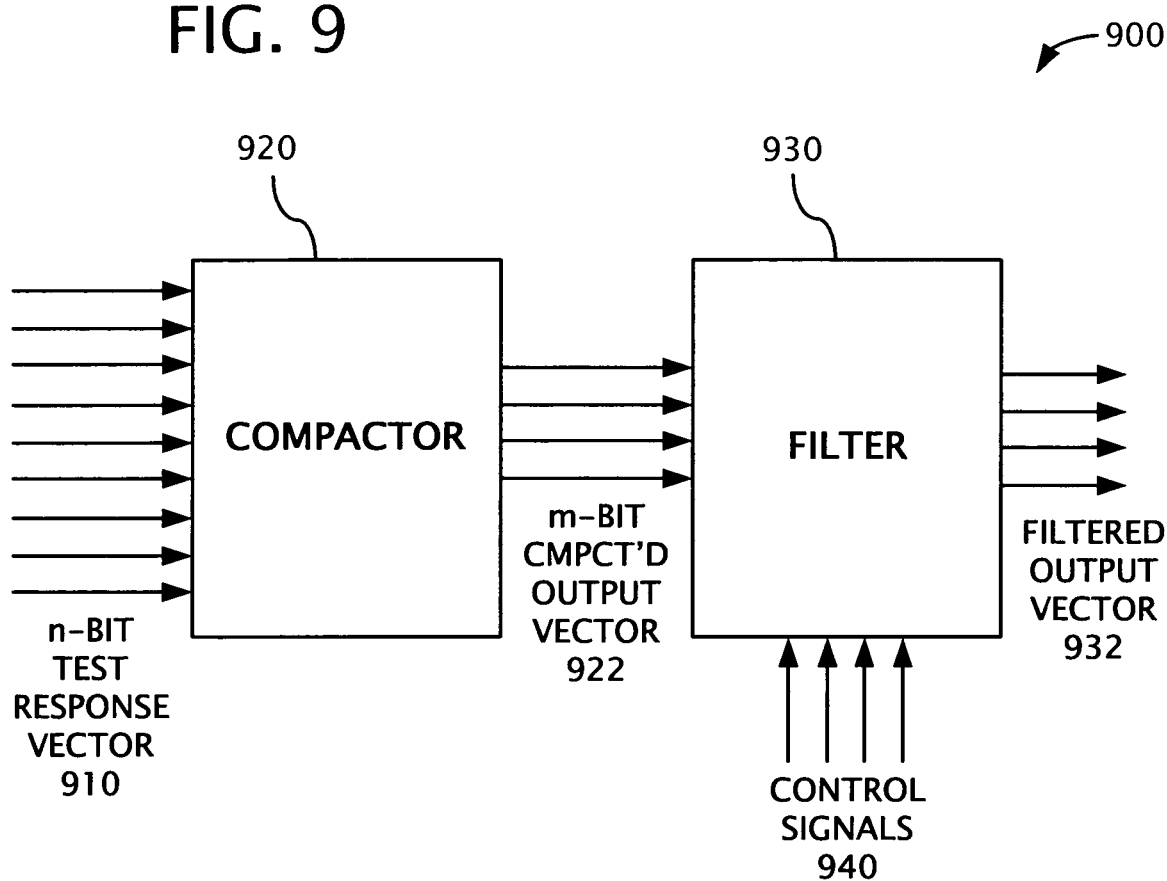
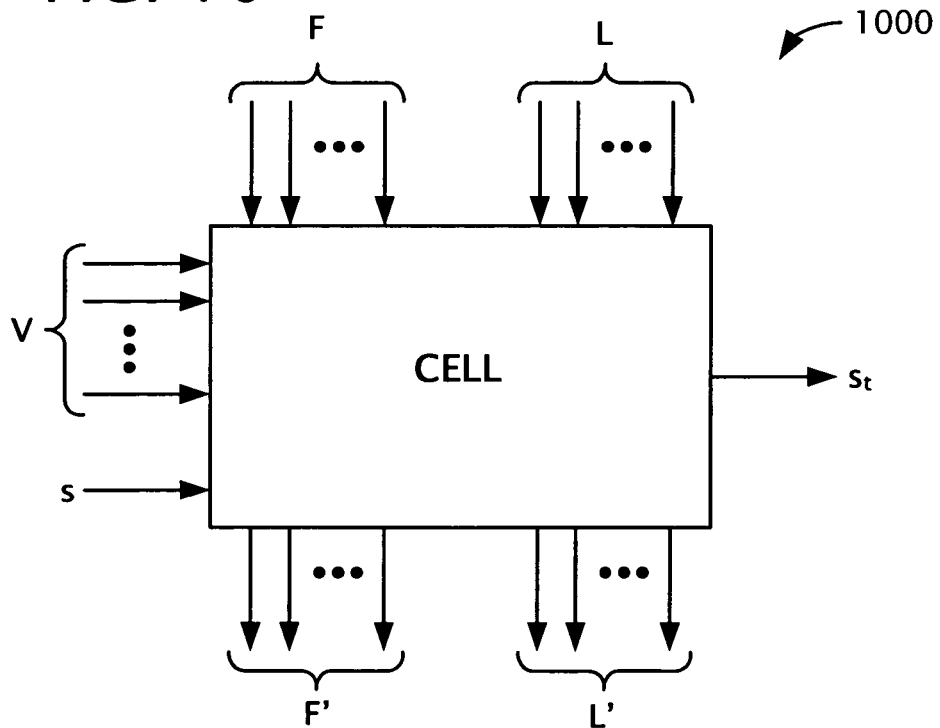

REMOVING THE EFFECTS OF UNKNOWN TEST VALUES FROM COMPACTED TEST RESPONSES

CROSS REFERENCE TO RELATED APPLICATION

This application claims the benefit of U.S. Provisional Application No. 60/634,878, filed Dec. 10, 2004, which is hereby incorporated herein by reference.

FIELD

This application relates generally to testing integrated circuits.

BACKGROUND

As integrated circuits are produced with greater and greater levels of circuit density, efficient testing schemes that guarantee high fault coverage while minimizing test costs and chip area overhead have become essential. The number of transistors that can be placed on a chip has been doubling roughly every eighteen months, as predicted by Moore's law. The amount of data required to test such massively complex chips has been increasing even more rapidly. In practical terms, for very large integrated circuits, the test cost is approaching (and may even exceed) the design cost. To address the rapid increase in volume of test data, a number of compression schemes have been developed.

Many integrated circuits are tested using structured design-for-testability ("DFT") techniques, which employ the general concept of making some or all state variables (for example, memory elements, such as flip-flops and latches) directly controllable and observable. Preferably, a circuit is treated, as far as testing of combinational faults is concerned, as a combinational or a nearly combinational network. The most-often used DFT methodology assumes that during testing all (or almost all) memory elements are connected into one or more shift registers termed "scan chains." See, for example, U.S. Pat. No. 4,503,537.

A circuit that utilizes scan chains for testing typically has two basic modes of operation: a normal mode and a test (or scan) mode. In the normal mode, the memory elements perform their regular functions. In the scan mode, the memory elements become scan cells that are connected to form a number of scan chains. These scan chains are used to shift test patterns into the circuit and to shift out circuit responses to the test patterns (referred to as "test responses"). The test responses can then be compared to fault-free responses to determine if the circuit-under-test ("CUT") works properly.

Scan design methodology has gained widespread adoption by virtue of its simple automatic test pattern generation ("ATPG") and silicon debugging capabilities. Today, ATPG software tools are so efficient that it is possible to generate test sets (a collection of test patterns and expected test responses) that guarantee almost complete fault coverage of several types of fault models including stuck-at and transition faults. It is also possible to target other fault models, such as path delay and bridging faults. As part of ATPG, unknown states (sometimes referred to as "X" states or "unknowns") in the test responses that are created upon application of one or more of the test patterns to the circuit-under-test are identified. Thus, the expected test responses may contain one or more unknown values. Unknown values typically result from limitations of simulation technology that cannot accurately predict the logic values of certain signals in a circuit during simulation. Because the actual logic values that these signals will assume in a manufactured circuit cannot be determined during simulation, the signals are designated as unknowns.

One type of scan design methodology that has gained widespread adoption is termed "full scan" and does not utilize any type of decompression or compression technique to reduce the size of the test data being sent and received by the external test hardware. Although full scan enables high test quality, the cost of full scan testing has become prohibitive because the number of scan cells in designs is increasing while the number of chip test pins and tester channels that can be used for scanning in and scanning out are limited. To compensate for this limitation, longer scan chains are typically used, implying larger test data volumes and longer chain load-unload times.

To overcome these issues, several test data compression techniques can be used that involve breaking long scan chains into a large number of shorter chains. To access the shorter chains using a relatively small number of test pins, test data decompression hardware (referred to herein as a "decompressor") is typically used on the input side of the CUT. Similarly, to reduce the number of test output pins, a test response compactor is used on the output side of the CUT to receive the test responses and to compact the responses, thereby producing "compacted test responses."

FIG. 1 shows an example of such a configuration. In particular, FIG. 1 is a block diagram of a system 100 for testing digital circuits with scan chains and compression hardware. During a typical scan mode, external automated test equipment ("ATE") or tester 102 applies a set of compressed test patterns 104 to a CUT 106 via input test pins 114. The compressed test patterns are input into a decompressor 110, which decompresses the compressed test patterns into the test patterns that are applied to the scan chains 108 within the CUT 106. Typically, the test patterns comprise a number of deterministically specified bits targeting one or more defects, and thus are termed "deterministic test patterns." Examples of compactors as may be used in the system 100 are described, for instance, in J. Rajski et al., "Embedded deterministic test for low cost manufacturing," *Proc. IEEE International Test Conference*, pp. 301-310 (2002). Once the scan chains 108 have been loaded with a decompressed test pattern, the CUT 106 is run in normal mode using the test patterns for input values. The CUT 106 may be run for a designated period of time (for example, one clock cycle) after which the circuit response to the test pattern (the test response) is captured and stored in the scan chains 108. With the circuit again in scan mode, the test response is clocked out of the scan chains 108 and into the compactor 112. The compactor 112 produces a compacted version of the test responses (in space, time, or both space and time), which is routed back to the tester 102 through output test pins 116. The tester 102 compares the compacted test responses 118 to expected, fault-free, versions 120 of the compacted test responses. From this comparison, a determination can be made as to whether the CUT 106 is operating as expected (for example, producing a "go" signal at node 122), or is not operating as expected (for example, producing a "no go" signal at the node 122).

Currently available test response compaction schemes can be grouped into three classes: (1) infinite input response compaction schemes (also known as "time compactors"); (2) finite memory compaction schemes; and (3) space compaction schemes (also known as "spatial compactors," "linear compactors," or "space compactors").

Time compactors typically have a feedback structure with memory elements for storing a signature, which represents the results of the test. After the signature is completed, it is read and compared to a fault-free signature to determine if an error exists in the circuit-under-test. Time compactors, for example, may use polynomial division, counting-based techniques, and check-sum-based methods, and are typically employed in built-in self-test (BIST) applications. The actual compaction is usually performed by linear finite state machines, such as a linear feedback shift register ("LFSR"), a MISR, or cellular automata. In general, time compactors cannot handle unknown states in a test response. For example, because these systems include feedback, an unknown state will circulate in the compactor endlessly until the compactor is reset. Thus, all states can become unknown after a few cycles, thereby corrupting the test signature and rendering the test useless.

Finite memory compactors are compactors that have memory but produce a finite response to a test response vector. Thus, for example, test response values that are input into the compactor can be clocked completely out of the compactor after a finite period of clock cycles and before an entire test response is loaded or an entire signature is output. Examples of such compactors are described in further detail in U.S. Published Patent Application No. 2004/0230884 entitled "Compressing Test Responses Using a Compactor," which is hereby incorporated herein by reference.

Space (or spatial) compactors comprise combinational circuits that are often predominantly built from XOR (or XNOR) networks and do not typically contain memory elements or any feedback structure. (Note, however, that a space compactor with memory elements inserted for pipelining purposes is still considered to be a space compactor). Spatial compaction networks are generally configured to generate m compacted test outputs from n scan chain outputs of the CUT, where m<n.

Space compactors typically offer smaller compaction ratios than time compactors, but are generally better suited to handle unknown states in a test response. For example, some spatial compaction schemes use coding theory to guide the design and implementation of the compactor. Such compactors are referred to generally as compactors using error correcting codes (ECC) or ECC-based compactors. However, in order to use ECC-based compactors in the presence of unknown values and to still detect an error, enhanced ATE support is usually needed (for example, for each scan out cycle, one might need to compare the compacted response to several different possible correct responses). This is not easily done in a conventional scan test environment. Alternatively, proper error detection may require post-processing, off-chip analysis of test responses in order to determine if they passed or failed. This can be problematic in "go/no-go" production testing, and can also increase the test time because storing test responses on a tester is slower than just comparing responses on chip pins.

In order to address these issues, one can expend more on chip as well as in tester data resources. One way to do this is to use specialized codes for designing the compactor that segregate the unknowns from the error information in the compacted response. However, creating such specialized codes can be extremely difficult, especially for multiple unknowns. In one known approach, referred to herein as the X-Compactor approach, for example, special codes to handle only a single unknown are presented. See Mitra, S., et al., "X-Compact: An Efficient Response Compaction Technique, IEEE Trans. on Computer-Aided Design of Integrated Circuits and Systems, Vol, 23, no. 3 (March 2004). Creating codes for handling more than one unknown requires solving an NP-complete problem. Moreover, approaches using these specialized codes, such as the X-Compactor approach, require many more output pins than other compactors using ECC. Consequently, the output response data storage requirement and the memory requirements on the ATE are significantly increased. The use of additional output pins to handle unknowns can be undesirable because only a fraction of the shift cycles ordinarily contain unknown values.

Another way to achieve the above objective is to mask the output response bits that are unknowns before compaction. This method typically does not increase the number of output pins, but requires additional input pins to pass the information concerning the location of the unknowns ("X" values) in the test response to the masking hardware. So, in order to mask up to x unknowns, the masking logic will require xlogn inputs (where n is the number of bits in the uncompacted test response). Once the unknown values are masked, the test response can be compacted using "off-the-shelf" error correcting codes. Because masking is done before the test response is compacted, however, this approach requires O(nx) additional hardware.

SUMMARY

Disclosed below are representative embodiments of methods, apparatus, and systems related to filtering or processing compacted test responses to remove the effect of one or more unknown values during integrated circuit testing that should not be construed as limiting in any way. Instead, the present disclosure is directed toward all novel and nonobvious features and aspects of the various disclosed methods, apparatus, systems, and equivalents thereof, alone and in various combinations and subcombinations with one another.

In one exemplary method of testing an integrated circuit, a plurality of compacted test response vectors is received from a compactor of a circuit-under-test. One or more of the compacted test response vectors have respective compacted test response values that are dependent on one or more respective unknown values. At least one of the compacted test response vectors is filtered to remove the dependency of the respective compacted test response values on the one or more respective unknown values. At least one filtered test response vector is output. The act of filtering can comprise receiving one or more control values associated with a respective compacted test response vector (for example, compressed control values), and controlling a network of combinational logic to logically combine at least two compacted test response values of the respective compacted test response vector in response to the one or more control values. The filter test response vector can include a respective filtered test response value indicative of an error that was masked by the one or more respective unknown values prior to filtering. The filtering can be performed, for example, by a programmable network of combinational logic coupled to the output of the compactor and configured to logically combine at least two of the respective compacted test response values in response to the one or more control values. The filter can, for example, be implemented on the same chip as the compactor or elsewhere (for instance, in the tester). In certain embodiments, the control values are received from a tester. Furthermore, the compactor can be a first compactor, and the filtered test response vector can be received by a second compactor.

In another exemplary method disclosed below, a compacted test response is received from a compactor of a circuit-under-test. The exemplary compacted test response includes one or more compacted test response values that are dependent on one or more unknown values. The compacted test response is filtered to remove the dependency of at least some of the compacted test response values on the unknown values, and the filtered test response is output. The filtered test response can include a filtered test response value indicative of an error that was masked by one of the unknown values in the unfiltered compacted test response.

In another exemplary method disclosed below, compacted test patterns and control signals are output to respective test input pins and control pins of one or more circuits-under-test. In this exemplary method, the control signals are indicative of bits in at least one compacted test response that depend on an unknown test value. The control signals can be received by filtering hardware on the circuits-under-test. The filtering hardware can be configured to logically combine bits in the compacted test response vector in response to the control signals. The act of outputting can involve coupling the respective test input pins and control pins of multiple circuits-under-test in parallel to output pins of a single external tester. The control signals can be compressed control signals, which can be received and decompressed by decompressors located on the circuits-under-test. The compressed test vector can also be decompressed by the decompressors.

One exemplary apparatus disclosed below is an apparatus used in testing a circuit-under-test. An embodiment of the apparatus comprises a compactor configured to receive a test response output from scan chains in the circuit-under-test, and a logic network coupled to the compactor and configured to receive the compacted test response output from the compactor. In this embodiment, the logic network is controllable by one or more control signals and configured to logically combine selected test values of the compacted test response in response to the control signals (for example, using one or more XOR or XNOR gates). The compactor can be, for example, a spatial compactor or finite memory compactor. The compactor can also be configured at least in part according to an error correcting code. For instance, the compactor can be a compactor implemented according to an error correcting code with a Hamming distance d. In this implementation, the logic network can be capable of removing the contributions of up to x unknowns to the compacted test response, where x is greater than zero and less than d. Further, the logic network can produce a filtered output that is indicative of up to e errors, where e+x<d. The logic network can also be configured to produce a filtered output vector that is indicative of the source of up to t errors, where 2t+x<d. The compactor can be a first compactor or compactor portion and the apparatus can further include a second compactor or compactor portion coupled to the logic network. In this implementation, the second compactor or compactor portion can be configured to receive filtered test response vectors output from the logic network. The second compactor or compactor can comprise, for example, one or more memory elements. In certain implementations of the apparatus, at least some of the selected test values are associated with an unknown value in the test response and are combined in order to at least partially remove the dependency of the compacted test response on the unknown value. Further, the logic network of the apparatus may comprise two or more cells of hardware having the same logic components as one another. The control signals can be capable of indicating a linear dependency of a first bit of the compacted test response on a second bit of the compacted test response. In certain implementations, an additional compactor is coupled to the logic network and is configured to receive filtered test responses output from the logic network. The additional compactor can comprise one or more memory elements and can be configured, for example, as a linear-finite-state-machine-based compactor.

Another exemplary apparatus disclosed below comprises a circuit-under-test that is part of an integrated circuit. The apparatus further includes at least one compactor coupled to the circuit-under-test and configured to compact test responses from the circuit-under-test, and a filter circuit coupled to an output of the compactor. In this apparatus, the filter circuit removes the effects of one or more unknown test values in the test responses compacted by the compactor. The compactor can be, for example, a spatial compactor, finite memory compactor, or other compactor. The filter circuit can comprise a logic network configured to combine selected test values of the compacted test responses in response to control signals. The apparatus may further include one or more control pins coupled to receive the control signals. The apparatus may further include a bypass network coupled between the compactors and the filter. The bypass network can be configured to receive compacted test response values from the compactor and to selectively output one or more of the compacted test response values so that they bypass the filter. In certain implementations, an additional compactor is coupled to the filter and is configured to receive filtered test responses output from the filter.

Another exemplary apparatus disclosed below is an electronic device comprising an integrated circuit with on-chip testing hardware operable to compact a circuit response to a test pattern and to optionally combine two or more values of the compacted circuit response through one or more logic gates. For example, the logic gates can be XOR or XNOR gates. Further, the on-chip testing hardware may operate in response to one or more control signals. The control signals, for instance, can be at least partially indicative of whether to combine any values of the compacted circuit response through the one or more logic gates, which values of the compacted circuit response to combine through the one or more logic gates, and/or which values of the compacted circuit response depend on an unknown test response value.

Any of the apparatus described herein can be designed, verified, and/or simulated using software that comprises computer-executable instructions stored on one or more tangible computer-readable media. Such software can comprise, for example, an electronic-design-automation (EDA) software tool, such as a design, verification, or simulation tool. Similarly, any of the methods described herein can be performed (at least in part) or simulated using software comprising computer-executable instructions stored on one or more tangible computer-readable media. Any such software can be executed on a single computer or on a networked computer (for example, via the Internet, a wide-area network, a local-area network, a client-server network, or other such network). Further, any of the disclosed apparatus can be stored as circuit design information on one or more tangible computer-readable media. For example, one or more data structures containing design information (for example, a netlist, HDL file, or GDSII file) can be created or updated to include design information for any of the disclosed apparatus. Such data structures can be created or updated at a local computer or over a network (for example, by a server computer). Tangible computer-readable media comprising filtered test responses or control signals for operating any of the disclosed apparatus are also disclosed and considered to be within the scope of the disclosed technology.

The foregoing and other objects, features, and advantages of the invention will become more apparent from the following detailed description, which proceeds with reference to the accompanying figures.

BRIEF DESCRIPTION OF THE DRAWINGS

FIG. 6 is a schematic block diagram illustrating conceptually how an error correcting code corresponds to a compaction operation.

FIG. 9 is a schematic block diagram illustrating an exemplary configuration of a compactor and filtering hardware coupled to the compactor.

FIG. 10 is a schematic block diagram of an exemplary filtering cell as may be used, for example, in the filtering hardware of FIG. 9.

DETAILED DESCRIPTION

Figure 1:
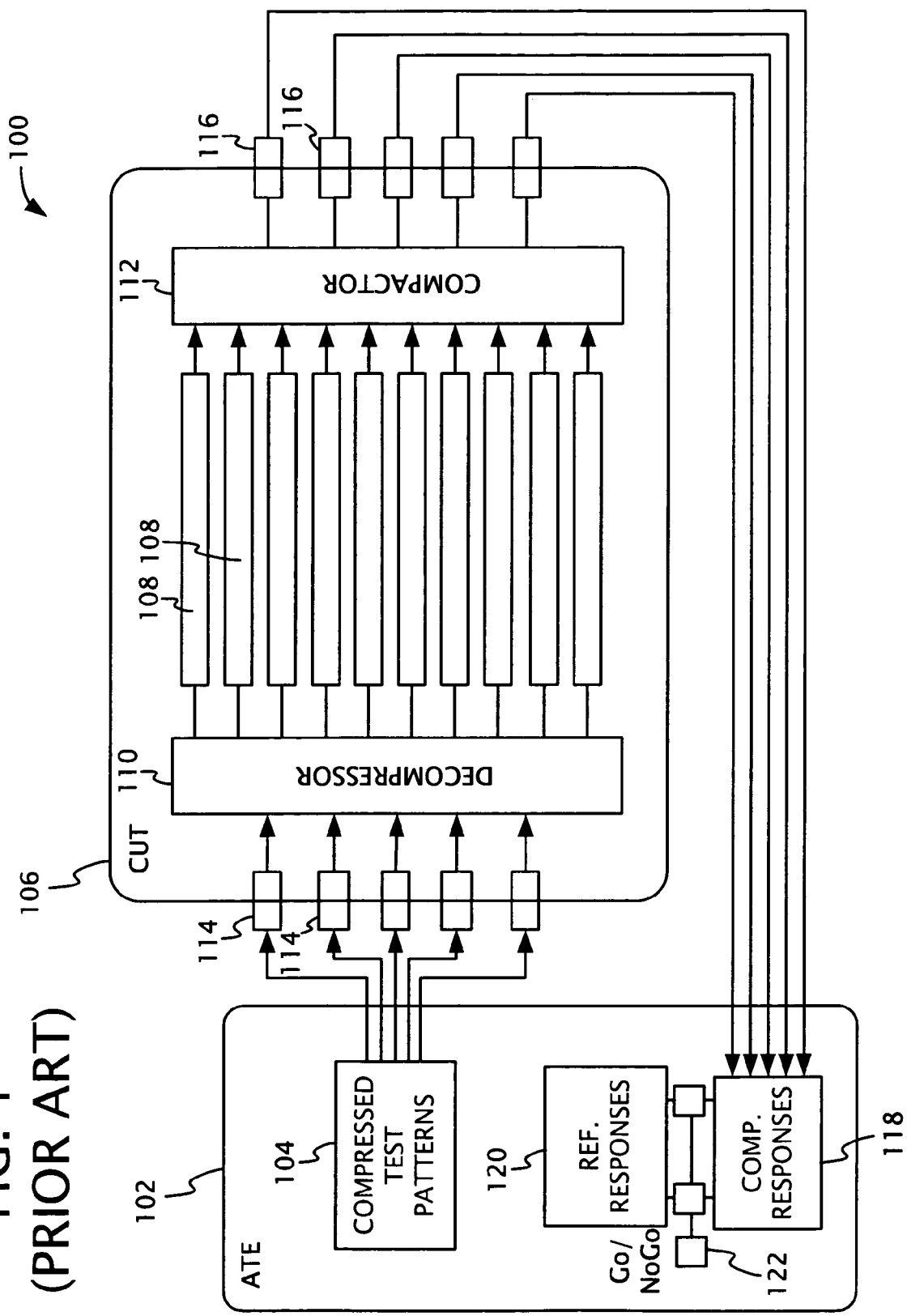
FIG. 1 is a schematic block diagram of an exemplary prior art system for testing digital circuits with scan chains and a compression hardware.

Disclosed below are representative embodiments of compaction and filtering techniques and associated apparatus that should not be construed as limiting in any way. Instead, the present disclosure is directed toward all novel and nonobvious features and aspects of the various disclosed methods, apparatus, and equivalents thereof, alone and in various combinations and subcombinations with one another. The disclosed technology is not limited to any specific aspect or feature, or combination thereof, nor do the disclosed methods and apparatus require that any one or more specific advantages be present or problems be solved. For example, many of the embodiments disclosed herein are described in connection with a spatial compactor. The disclosed technology, however, is not limited for use with spatial compactors, but may alternatively be used with other types of compactors, such as finite memory compactors (for example, a convolutional compactor) or time compactors.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus. Additionally, the description sometimes uses terms like "determine" and "select" to describe the disclosed methods. These terms are high-level abstractions of the actual operations that are performed. The actual operations that correspond to these terms will vary depending on the particular implementation and are readily discernible by one of ordinary skill in the art. Further, the disclosed embodiments are typically implemented using one or more logic gates (for example, XOR or XNOR gates), which are assumed to operate according to modulo-2 arithmetic unless otherwise stated. The disclosed technology, however, is not limited to such implementations, as other suitable components can be used to achieve the desired functionality.

The disclosed compactor and filter embodiments can be implemented in a wide variety of integrated circuits that utilize scan-based testing (for example, application-specific integrated circuits (ASICs) (including mixed-signals ASICs), systems-on-a-chip (SoCs), or programmable logic devices (PLDs) such as field programmable gate arrays (FPGAs)). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits with embodiments of the disclosed technology or equivalents are considered to be within the scope of this disclosure.

Any of the apparatus described herein can be designed, verified, and/or simulated using software that comprises computer-executable instructions stored on one or more tangible computer-readable media. Such software can comprise, for example, an electronic-design-automation (EDA) software tool, such as a design, verification, or simulation tool. Similarly, any of the methods described herein can be performed or simulated (at least in part) using software comprising computer-executable instructions stored on one or more tangible computer-readable media. For example, a software tool can be used to determine one or more control signals used to control any of the disclosed apparatus in order to remove the effects of one or more unknown values that are present in test responses to one or more test patterns. Any such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

Further, any of the disclosed apparatus can be stored as circuit design information on one or more tangible computer-readable media. For example, one or more data structures containing design information (for example, a netlist, HDL file, or GDSII file) can be created or updated to include design information for any of the disclosed apparatus. Such data structures can be created or updated at a local computer or over a network (for example, by a server computer). Similarly, filtered test responses produced by any of the disclosed apparatus or control signals used to operate any of the disclosed apparatus can be stored on one or more tangible computer-readable media (for example, in one or more data structures). Such tangible computer-readable media are considered to be within the scope of the disclosed technology.

I. Compactor Design Considerations

A. Error Correcting Codes, in General

In this section, the use of error correction codes for designing compactors, such as spatial compactors, is discussed. See also J. H. Patel, S. Lumetta, and S. M. Reddy, "Application of Saluja-Karpovsky Compactors to Test Responses with Many Unknowns," *Proc. IEEE VLSI Test Symp.*, pp. 107-112 (2003). For purposes of this disclosure, the following convention is used for symbols: uppercase bold-face symbols denote matrices and sets, lowercase bold-face symbols denote vectors, and non-bold-face symbols are used to denote scalar variables.

Figure 2:
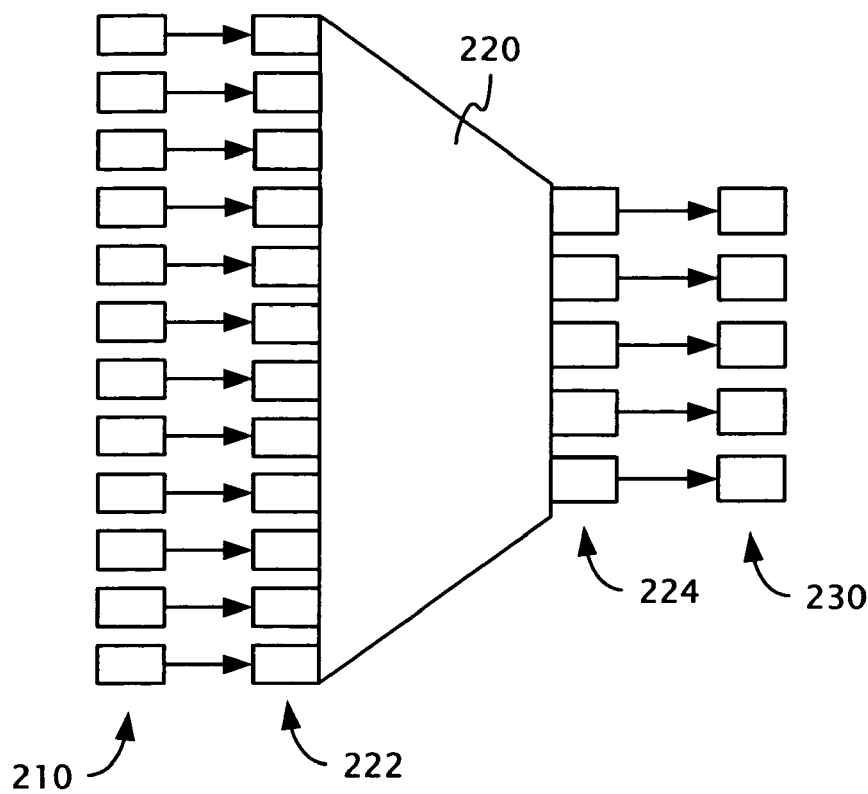
FIG. 2 is a schematic block diagram illustrating an exemplary compaction process.
Figure 3:
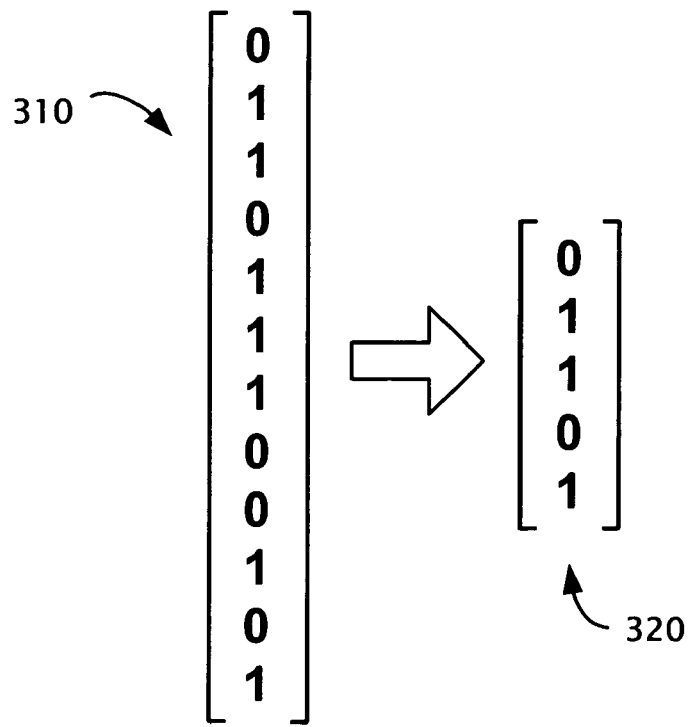
FIG. 3 is a schematic block diagram illustrating the compaction process of FIG. 2 using matrix notation.

A spatial compactor of test responses can be described as receiving an n-bit test response vector (denoted by an n×1 vector t) from n scan chains during a shift-out cycle. The compactor compacts the test response vector into an m-bit output vector (denoted by an m×1 vector s). FIG. 2 is a block diagram schematically illustrating an exemplary compaction process. In FIG. 2, scan chain outputs 210 are coupled to inputs 222 of a spatial compactor 220 and, in the illustrated embodiment, provide an n-bit test response to the spatial compactor 220 each shift-out clock cycle. The compactor 220 typically comprises a network of combinational logic (for example, XOR or XNOR gates) that logically combines the bits of test response vectors in a predictable manner (for example, according to a known compaction function) and produces m-bit compacted output vectors (also referred to as a "compacted test response") at compactor outputs 224. As seen in FIG. 2, the m-bit output vector comprises fewer bits than the n-bit test response vector (in other words, m is less than n). The compactor outputs 224 are typically coupled to output nodes 230, which may comprise output test pins of the circuit-under-test. FIG. 3 is a schematic block diagram conceptually illustrating the compaction function of FIG. 2 using matrix notation. Specifically, the compaction function performed by the compactor 220 can be viewed as a function that modifies the test response vector t (shown as vector 310) into the compacted output vector s (shown as vector 320). Since m is less than n, the mapping from t to s is a many-to-one mapping.

Based on the above, a spatial compactor can also be described as exhaustively partitioning the set of all possible n-bit binary vectors into $2^m$ sets, which can be denoted as sets $T_i (0 \leq i < 2^m)$. According to this notation, a set $T_i$ consists of the test response vectors that are mapped to the same m-bit compacted output vector. Thus, if m is 2, then four sets $T_i$ exist, each corresponding to one of the four possible compacted outputs: (0,0), (0,1), (1,0), and (1,1), respectively. Each set $T_i$ consists of the test response vectors that produce the corresponding compacted output vector.

If the compaction scheme is to allow the detection of up to e errors in the test response (that is, unexpected test response values resulting, for example, from one or more defects in the circuit-under-test) in the presence of up to x unknowns in a given scan-out shift cycle, the test response vectors in the corresponding set $T_i$ should be separated from one another by a Hamming distance d where d>e+x. Such a set $T_i$, which contains binary vectors which are at least a Hamming distance d from each other, implements a distance d, binary error correcting code. See, e.g., R. Blahut, *Algebraic Codes for Data Transmission*, Cambridge University Press (2003).

Figure 4:
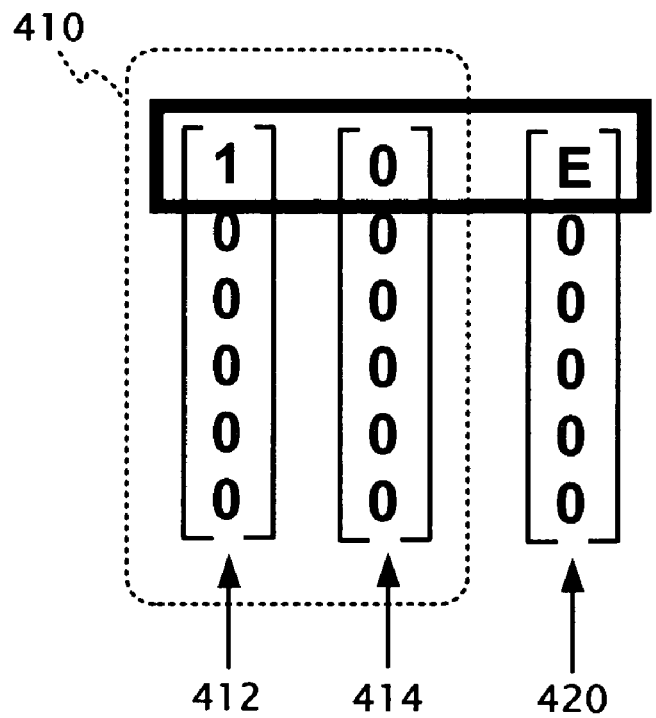
FIG. 4 is a schematic block diagram illustrating exemplary test response vectors having a Hamming distance of one.
Figure 5:
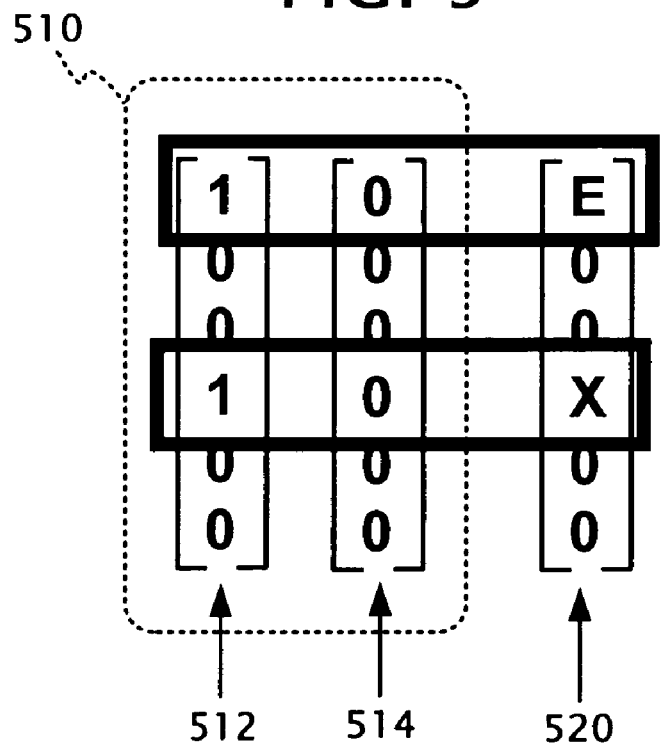
FIG. 5 is a schematic block diagram illustrating exemplary test response vectors having a Hamming distance of two.

As used herein, and explained below in FIGS. 4 and 5, the Hamming distance refers to the number of bits that are different between two given vectors in a set $T_i$. FIGS. 4 and 5 comprise block diagrams that illustrate how Hamming distances relate to error detection and toleration of unknown states. FIG. 4 conceptually illustrates a first exemplary test response vector 412 and a second exemplary test response vector 414 that are part of an exemplary set 410. The Hamming distance between the two test response vectors 412, 414 is one because only one bit differs between the vectors. Assume now that a defect exists in the circuit-under-test such that the first bit in the test response vector 412 produces a "0" instead of a "1," but all other bits of the test response vector 412 remain the same. In this situation, the faulty test response vector is identical to the second test response vector 414 in the set 410. Consequently, the compacted test response vector produced by the compactor would not change in the presence of the error, and the fault would not be detected. For this same reason, an error in the first bit of the second test response vector 414 would also remain undetected. Accordingly, detection of a single error is not guaranteed by a compactor producing a compacted test response defined by the set 410. In the example of FIG. 4, the compactor cannot guarantee detection of the faulty test response vector 420. Instead, in order to detect a single error after compaction in the absence of any unknown states, the Hamming distance should be at least two.

FIG. 5 illustrates a second example using a first exemplary test response vector 512 and a second exemplary test response vector 514 that are part of an exemplary set 510. The Hamming distance between the test response vectors 512, 514 in this example is two because two bits differ between the vectors. As with FIG. 4, assume that a defect exists in the circuit-under-test such that the first bit in the test response vector 512 produces a "0" instead of a "1." Also assume that the fourth bit in the test response vector 512 is an unknown value. In this situation, the faulty test response vector may be identical to the second test response vector 514 in the set 510 (for example, if the unknown value is actually "0"). Consequently, the compacted test response vector produced by the compactor may not change in the presence of the error and the unknown value, and the fault may be not be detected. For the same reasons, an error in the first bit of the second test response vector 514 may also not be detected. Accordingly, detection of a single error in the presence of a single unknown is not guaranteed by a compactor producing a compacted test response defined by the exemplary set 510. In the particular example of FIG. 5, the compactor cannot guarantee detection of the faulty test response vector 520. Instead, in order to detect a single error after compaction in the absence of any unknown states, the Hamming distance should be at least three.

The above discussion indicates that error correcting codes can be used to implement spatial compactors. Exemplary techniques for implementing such spatial compactors are discussed in the following paragraphs. According to one technique, for instance, a class of error correcting codes, called binary linear block codes, is used to implement a spatial compactor. For purposes of this discussion, an (n, k, d) binary linear code is defined as a set of $2^k$ n-bit vectors (termed "codewords") wherein the minimum Hamming distance between any two codewords is d. The first set, $T_0$, of test response vectors is chosen to be an appropriate (n, k, d) code where n−k=m, and the "cosets" of this code form the remaining $2^m-1$ sets. For purposes of this discussion, a coset (also referred to as a "translate") of an (n, k, d) binary linear code is defined as the set of vectors obtained by adding a fixed n-bit vector a to all the codewords. Note that a coset is also a set of $2^k$ n-bit vectors with a minimum Hamming distance d (that is, a coset is also an (n, k, d) binary linear code).

One way to describe a code and its cosets is through a parity check matrix, H. For example, a parity check matrix H of an (n, k, d) code can be defined as an (n−k)×n matrix (that is, an m×n matrix) with rank (n−k) such that an n-bit vector c is a codeword if and only if H·c=0. For an n-bit vector a, the product H·a is sometimes referred to as the "syndrome" of a and can be denoted by S(a).

According to a first theorem (referred to as the "first ECC theorem"), two n-bit vectors a and b belong to the same coset if and only if their syndromes are equal. The proof for this first theorem is well known and can be found in any standard coding theory text. See, for example, R. Blahut, *Algebraic Codes for Data Transmission*, Cambridge University Press (2003). Further, according to a second theorem (referred to as the "second ECC theorem"), if a distance d code is used to implement the compactor, then: (1) up to d−1 single-bit errors in a single shift cycle can be detected; (2) up to e single bit errors can be detected in the presence of x unknowns in the same shift cycle, where e+x<d; and (3) up to t errors can be corrected in the presence of x unknowns in the same shift cycle, where 2t+x<d. See J. H. Patel, S. Lumetta, and S. M. Reddy, "Application of Saluja-Karpovsky Compactors to Test Responses with Many Unknowns," *Proc. IEEE VLSI Test Symp.*, pp. 107-112, 2003.

FIG. 6, for instance, illustrates the use of an error correcting code (represented through its parity check matrix H) to perform a compaction operation. In use, a spatial compactor can be configured to implement the error correcting code. Thus, for example, the parity check matrix H is representative of how the network of XOR gates in the spatial compactor is coupled to the scan chain outputs of the CUT. In FIG. 6, the compactor is represented by the parity matrix 610, which comprises an (n−k)×n matrix (that is, an m×n matrix). Specifically, for the parity matrix 610, n=8 and m=4. Further, the example parity matrix 610 has a Hamming distance of "4". A test response vector t comprising an n×1 vector (such as the example test response vector 620) corresponds to n values output from the scan chains of a CUT during a scan-out cycle. The basic compaction operation performed by a compactor implementing a parity check matrix H can be written as: H·t=s, where s is an m-bit compacted output vector corresponding to the compacted test response. In the example shown in FIG. 6, for instance, the compacted output vector 630 (s) is a 4-bit vector. Further, because the compactor implementing the parity matrix H in this example does so using an XOR network, the compacted output vector 630 is calculated using modulo-2 arithmetic. Thus, the 4-bit compacted output vector 630 comprises the values: "1, 1, 1, 0," instead of "3, 3, 1, 2." (In the other examples described herein, modulo-2 arithmetic will be assumed unless otherwise stated.)

B. Limitations of Using Error Correcting Codes for Test Response Compaction

Even though compactors implemented using error correcting codes achieve good compaction ratios and allow error detection and correction in the presence of multiple unknowns, incorporating such compactors into a conventional test environment, such as the one illustrated in FIG. 1, can be difficult. For example, such compactors typically require special ATE support. The reason for this special support can be explained through the following example. Assume for purposes of this example that an (8, 4, 4) extended Hamming code represents the compaction function. This exemplary code will compact the output of 8 scan chains into 4-bit output vectors. Further, this code will allow the detection of up to 3−x errors in the presence of x unknowns and the correction of one error in the presence of one unknown. An example parity check matrix H for this code is:

$$H = \begin{bmatrix} 1 & 1 & 1 & 0 & 1 & 0 & 0 & 0 \\ 1 & 1 & 0 & 1 & 0 & 1 & 0 & 0 \\ 1 & 0 & 1 & 1 & 0 & 0 & 1 & 0 \\ 1 & 1 & 1 & 1 & 1 & 1 & 1 & 1 \end{bmatrix} \quad (1)$$

Now consider a test response vector t':

$$t' = [0\ 0\ 0\ X_0\ X_1\ 0\ 0\ 0] \quad (2)$$

where the ' symbol (the prime symbol) indicates the transpose, and where $X_0$ and $X_1$ are unknown values. For the test response vector t', the four-bit compacted output vector s'=[$s_0\ s_1\ s_2\ s_3$] will be:

$$s_0 = X_1$$

$$s_1 = X_0$$

$$s_2 = X_0$$

$$s_3 = X_0 + X_1 \quad (3)$$

This means that, depending on the actual values of the unknowns from the circuit-under-test, the compacted output vector may have four different correct values: 0000, 0111, 1001 and 1110. In other words, on a tester (such as ATE), one will have to compare the compacted output to four different expected values in order to ascertain that the test passed. This is typically hard to implement on a conventional tester, especially in the context "go/no-go" production testing.

As another implementation strategy, the compacted output vector from a circuit-under-test can be stored on the tester and post-processed after the test is complete to determine if it passed or not. Such a strategy has several disadvantages. For example, post-processing analysis does not fit into the "go/no-go" production test environment, and storing data on the tester during testing can significantly slow down the overall test. Further, only a limited amount of data can be stored on the tester. The memory limitations of a tester are further complicated during wafer sort, where the test output is not typically offloaded from the tester until all dies have been tested. Consequently, a large amount of output data will have to be stored on the tester. Further, the above-described implementation strategies are not well suited for situations in which multiple chips are tested in parallel using a single tester.

To help address one or more these issues, embodiments of the filtering technique described below can be utilized.

II. Removing the Effects of Unknown States

A. General Theory

One limitation with using "off-the-shelf" ECC for compaction is that the unknown values in the test responses output from the scan chains cause the compacted test responses to have more than one "correct" value depending on what actual values the unknowns take on the circuit-under-test. In order to help address this problem, the compacted test responses can be processed using embodiments of the filtering techniques described below. Because the disclosed techniques can be used to reduce or remove the effects of unknown (or "X") values on compacted test responses, embodiments of the described filtering techniques are sometimes generally referred to as "X-filtering techniques." Similarly, the hardware implementations of the techniques are sometimes referred to as "X-filters."

To illustrate an exemplary application of an X-filtering technique, the example introduced in the previous section will be used. In general, a test response vector t can be broken down into three components:

$$t = t_k + t_x + t_e \quad (4)$$

The exemplary vector component $t_k$ contains the one or more known bits in t and zero (or other fixed value) in locations corresponding to the unknown bits. The exemplary vector component $t_x$ contains the one or more unknown bits in t and zero (or other fixed value) in all other locations. The exemplary vector component $t_e$ contains the one or more error bits and zero (or other fixed value) in the remaining locations. Now, as in the example introduced above in Equations (1) and (2), consider a case where the fourth and fifth bits in the test response vector t are unknown and there is an error in the seventh bit location. The vector components of this test response can be written as:

$$t'_k = [d_0 \quad d_1 \quad d_2 \quad 0 \quad 0 \quad d_5 \quad d_6 \quad d_7] \quad (5)$$
$$t'_x = [0 \quad 0 \quad 0 \quad X_0 \quad X_1 \quad 0 \quad 0 \quad 0]$$
$$t'_e = [0 \quad 0 \quad 0 \quad 0 \quad 0 \quad 0 \quad e_0 \quad 0]$$

Based on the above and using the parity check matrix from Equation (1), the output vector s can be written as:

$$\begin{aligned}
s_0 &= d_0 + d_1 + d_2 &&+ X_1 \\
s_1 &= d_0 + d_1 + d_5 &&+ X_0 \\
s_2 &= d_0 + d_2 + d_6 &&+ e_0 + X_0 \\
s_3 &= d_0 + d_1 + d_2 + d_5 + d_6 + d_7 &&+ e_0 + X_0 + X_1 \\
s &= s_k &&+ s_e + s_x
\end{aligned} \quad (6)$$

As with the test response vector t, the test response bits contributing to the compacted output vector s can be broken down into three components: (1) known bits ($s_k$); (2) unknown bits ($s_x$); and (3) error bits ($s_e$). Focusing just on the unknowns ($s_x$), $X_0$ and $X_1$ can be represented by four linear expressions. Specifically, it can be seen that the first two expressions of the unknowns $X_0$ and $X_1$ ("$X_1$" in $s_0$ and "$X_0$" in $s_1$, respectively) are linearly independent of one another (that is, they are not linear combinations of one another), whereas the last two expressions ("$X_0$" in $s_2$ and "$X_0+X_1$" in $s_3$, respectively) are linearly dependent on the first two. In other words, the last two expressions can be expressed as linear combinations of the first two expressions.

According to the disclosed technology, these linear relationships can be used to remove the dependence of the output vector s on the unknown values. For example, the following exemplary technique can be used: (1) ignore those bits in s corresponding to the linearly independent expressions in $s_x$; and (2) combine appropriate linear combinations of the bits in s corresponding to the linearly independent expressions to the bits in s corresponding to the linearly dependent expressions in $s_x$. The order in which the bits of s are considered may vary from implementation to implementation, but in the examples discussed herein, it is assumed that the bits are considered in ascending numerical order ($s_0, s_1, \ldots s_n$).

Applying this exemplary technique to the example introduced above, the output vector bits of $s_0$ and $s_1$ would be ignored because they recite linearly independent expressions of the unknowns $X_0$ and $X_1$ in $s_x$. Specifically $s_0$ includes $X_1$, whereas $s_1$ includes $X_0$. To eliminate the unknown $X_0$ in $s_2$, the output vector bits of $s_2$ and $s_1$ would be combined. To eliminate the unknowns $X_0$ and $X_1$ in $s_3$, both $s_1$ and $s_0$ would be combined with $s_3$. Consequently, the following filtered output vector $s_f$ would be obtained:

$$s_f = \begin{bmatrix} 0 \\ 0 \\ s_2 + s_1 \\ s_3 + s_1 + s_0 \end{bmatrix} = \begin{bmatrix} 0 \\ 0 \\ d_1 + d_2 + d_5 + d_6 + e_0 \\ d_0 + d_1 + d_6 + d_7 + e_0 \end{bmatrix} \quad (7)$$

The following observations can be made about the filtered output vector $s_f$. First, the bits in $s_f$ do not depend on the value of the unknowns. Second, the error bit is preserved in the last two bits of $s_f$. Thus, the error will be detected in $s_f$. In fact, according to this embodiment, any single-bit error in the known bits of the test response vector will be detected in $s_f$.

As another example, consider a test response vector with one unknown in the third bit-location:

$$t'_k = [d_0 \quad d_1 \quad 0 \quad d_3 \quad d_4 \quad d_5 \quad d_6 \quad d_7] \quad (8)$$
$$t'_x = [0 \quad 0 \quad X_0 \quad 0 \quad 0 \quad 0 \quad 0 \quad 0]$$

Applying the same compaction scheme as defined by the parity check matrix H from Equation (1), the compacted output vector s will be:

$$s_0 = d_0 + d_1 + d_4 \qquad\qquad + X_0 \qquad (9)$$
$$s_1 = d_0 + d_1 + d_3 + d_5$$
$$s_2 = d_0 + d_3 + d_6 \qquad\qquad + X_0$$
$$s_3 = d_0 + d_1 + d_3 + d_4 + d_5 + d_6 + d_7 + X_0$$
$$s = s_k \qquad\qquad\qquad\qquad\qquad + s_x$$

In this example, the first output vector bit ($s_0$) is linearly independent, whereas the last two output vector bits ($s_2$ and $s_3$) are linearly dependent on the first. Therefore, after applying the exemplary X-filtering technique as described above, the following filtered output vector will be obtained:

$$s_f = \begin{bmatrix} 0 \\ s_1 \\ s_2 + s_0 \\ s_3 + s_0 \end{bmatrix} = \begin{bmatrix} 0 \\ d_0 + d_1 + d_3 + d_5 \\ d_1 + d_3 + d_4 + d_6 \\ d_3 + d_5 + d_6 + d_7 \end{bmatrix} \qquad (10)$$

Assume, for example, that the two bits $d_0$ and $d_1$ are in error. Because the third bit of $s_f$ includes $d_1$ but not $d_0$, the error will be detected in the third bit. As another example, assume that the fourth bit of $s_f$ shows an error. Assuming that the error is a single-bit error, one can uniquely attribute the error to the scan cell associated with $d_7$. In general, in this exemplary embodiment, any two-bit errors can be detected and any single-bit error can be uniquely identified and corrected.

Figure 16:
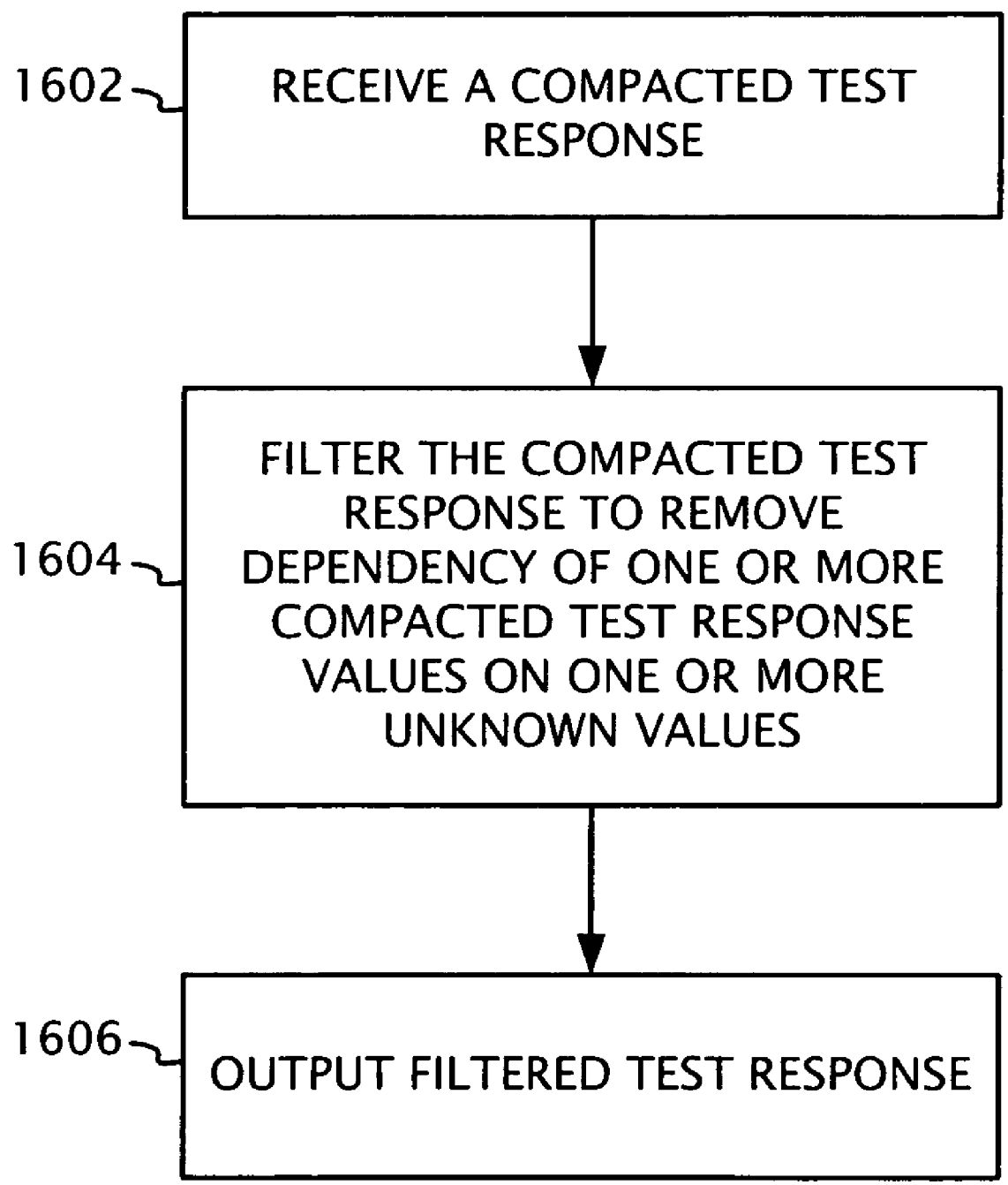
FIG. 16 is a flowchart of a method for fault diagnosis utilizing the network of FIG. 15.

FIG. 16 is a flow chart of a general method 1600 for applying embodiments of the disclosed filtering technology. At process block 1602, a compacted test response is received. For example, the compacted test response may be received from outputs of a compactor (for example, a spatial compactor or finite memory compactor). Further, as discussed above, the compacted test response can comprise one or more compacted test response values that are dependent on one or more respective unknown values. At process block 1604, the compacted test response is filtered to remove the dependency of at least some of the compacted test response values on the respective unknown values. For example, compacted test response values in a test response vector that are dependent on a common unknown value can be logically combined (for example, via an XOR, XNOR, or other such gate), thereby removing the contribution of the unknown value in the resulting value. As more fully discussed below, this filtering operation can be performed in a variety of different hardware embodiments, including a programmable or controllable filter (for example, a programmable network of combinational logic), which may be located on the same chip as the compactor. Any such filtering hardware can be controlled via one or more control values, which may be input from external ATE or other hardware. At process block 1606, a filtered test response is output. The filtered test response can be output to, for example, test output pins of the circuit-under-test and received by ATE. The filtered test response can contain one or more test response values that indicate an error value and that was previously masked by one or more of the unknown values in the unfiltered compacted test response.

Figure 7:
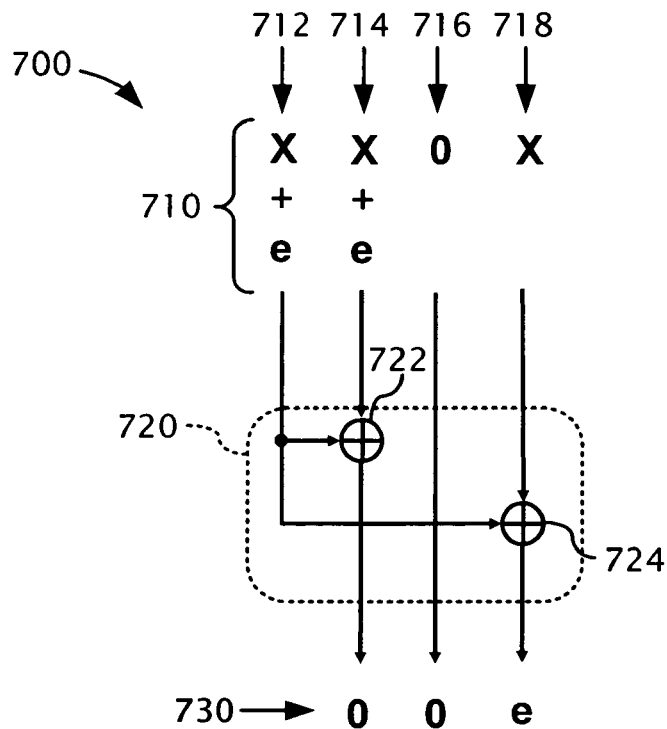
FIG. 7 is a schematic block diagram illustrating an example of filtering a compacted test response vector to remove the effect of an unknown value.

FIG. 7 is a block diagram 700 illustrating schematically an example of filtering a compacted test response to remove the effects of unknown values. Specifically, FIG. 7 shows a compacted test response vector 710 wherein the first value 712, second value 714, and fourth value 718 are each dependent on a common unknown value ("X"), and wherein the first value 712 and the second value 714 are dependent on an error value ("e"). The compacted test response vector 710 is input into a filter 720 comprising two XOR gates 722, 724 configured to logically combine the first value 712 with the second and fourth values 714, 718, respectively, in order to cancel the effects of the unknown value ("X"). A filtered test response vector (also referred to as a "filtered output") 730 is output from the filter 720 and contains no values that are dependent on the unknown value X. In other words, the unknown value X does not contribute or otherwise determine any of the values in the filtered output 730. Moreover, although the illustrated filtered output 730 shows three values, it may further include one or more additional values (for example, null values) that can be ignored during any fault diagnosis. For example, the filtered output 730 may include a "0" corresponding to the first value 712 so that the filtered output has the same number of bits as the compacted test response vector. Further, although the linear combination of the first value 712 with the second value 714 canceled the error e, the combination of the first value 712 with the fourth value 718 propagated the error to the filtered output 730. Thus, the error e can be detected in the filtered output 730.

Figure 8:
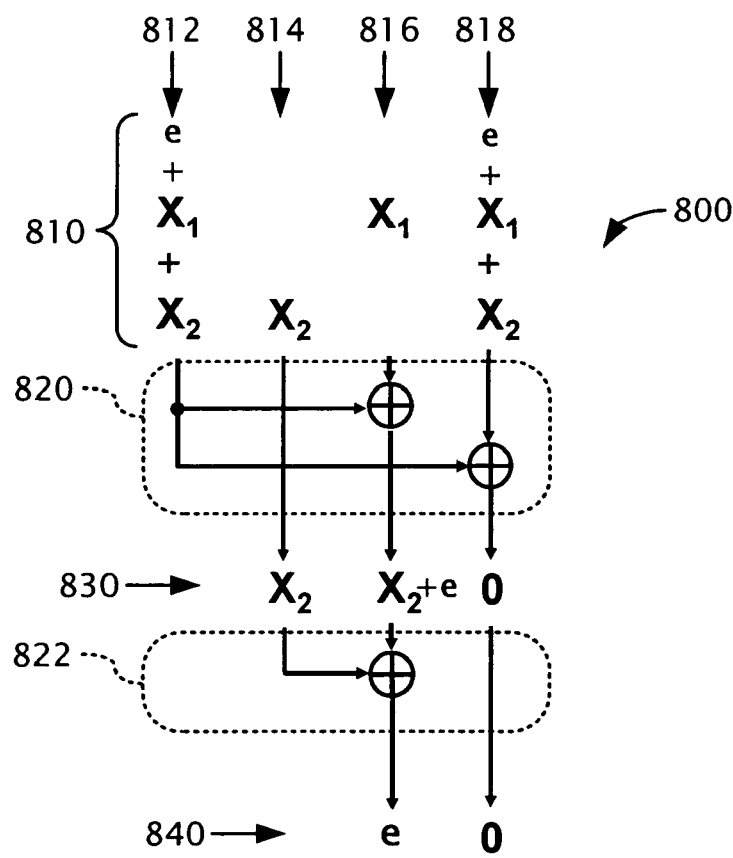
FIG. 8 is a schematic block diagram illustrating an example of filtering a compacted test response vector to remove the effects of two unknown values.

In order to detect an error in the presence of multiple unknown values, additional filtering can be performed. For example, FIG. 8 is a schematic block diagram 800 illustrating an example of two-stage filtering used to remove the effects of two unknowns. In particular, FIG. 8 shows a compacted test response vector 810 wherein the first value 812 is dependent on a first unknown value ("$X_1$"), a second unknown value ("$X_2$") and an error value ("e"); the second value 814 is dependent on $X_2$, the third value 816 is dependent on $X_1$, and the fourth value 818 is dependent on $X_1$, $X_2$, and e. The compacted test response vector 810 is input into a first stage filter 820 comprising two XOR gates configured to logically combine the first value 812 with the third and fourth values 816, 818 in order to cancel the effects of the unknown value $X_1$. Though the first value 812 is combined with the third and fourth values 816, 818, other combinations are possible (for example, the third value 814 could be combined with the first and the fourth values 812, 818, respectively). A partially filtered output 830 is output from the first stage filter 820 and contains no values that are dependent on the unknown value $X_1$. The partially filtered output 830 is input into a second-stage filter 822, which in this example comprises a single XOR gate configured to cancel the effects of the unknown value $X_2$. Specifically, the first value of the partially filtered output 830 is logically combined with the second value via the XOR gate. The second-stage filter 822 outputs a filtered output 840. The filtered output 840 contains no values that are dependent on the unknown values $X_1$ and $X_2$. Accordingly, the error e will be detected in the filtered output 840. Further, and as explained above with respect to FIG. 7, the filtered output 840 can comprise one or more additional values (null values) that are ignored during any diagnosis so that the filtered output has the same number of bits as the compacted test response vector. Moreover, although only two stages of filtering are shown, additional filtering stages can be added in order to filter the effects of additional unknown values. For example, the number of filtering stages can depend on the number of unknown values present during application of a particular test pattern and may vary on a pattern-by-pattern, vector-by-vector, or cycle-by-cycle basis. Further, the use of XOR gates in FIGS. 7 and 8 should not be construed as limiting, as other logic gates may be used in order to obtain the same or equivalent results (for example, XNOR gates and the like).

Although a particular hardware configuration is shown in FIGS. 7 and 8, the hardware used to implement the filtering functions may vary depending on the implementation. For example, and as more fully explained below, the filtering hardware can be designed to be reconfigurable or programmable in response to one or more control signals in order to apply different filtering operations on a cycle-by-cycle, value-by-value, pattern-by-pattern, or other basis. Before discussing embodiments of this type of implementation, however, the next section will describe the X-filtering technique more formally.

B. Formal Description of Exemplary X-Filtering Technology

In this section, examples of the X-filtering technique are more formally described. In particular, certain properties of the X-filtering techniques are mathematically proven for the case where the compactor is a spatial compactor implemented using an error correcting code. This particular implementation, however, should not be construed as limiting, as X-filtering techniques as described herein are more generally applicable to other compactors.

First, an m×x matrix $H_x$ is defined. For purposes of this discussion, assume that matrix $H_x$ contains all the columns of the parity check matrix H corresponding to the locations of the unknowns in a test response. Second, an m×m matrix termed the "X-filter matrix" and denoted by $DX(H_x)$ is defined. The X-filter matrix is a function of the unknown locations in the test response. For example, in the described embodiment, the i-th column of $DX(H_x)$ corresponds to the i-th bit of the compacted output vector $s_i$, and row i of $DX(H_x)$ describes the X-filtering action for $s_i$.

The X-filter matrix can be constructed as follows. Given the locations of the unknowns in $H_x$, the rows of $H_x$ that are linearly independent can be determined. The rows of $DX(H_x)$ corresponding to the linearly independent rows can then be set as all zeros (or other fixed value). The rows of $DX(H_x)$ corresponding to the remaining linearly dependent rows in $H_x$ can define the linear dependence relation for those rows. For example, a linearly dependent row of $DX(H_x)$ can include a "1" in the column corresponding to the linearly dependent row itself and a "1" in the other columns corresponding to the rows in $H_x$ on which the row linearly depends. As an example, consider again the test response vector given in Equation (2). The matrix $H_x$ (from Equation(1)) and the X-filter matrix $DX(H_x)$ for these locations of the unknowns will be:

$$H_x = \begin{bmatrix} 0 & 1 \\ 1 & 0 \\ 1 & 0 \\ 1 & 1 \end{bmatrix}; DX(H_x) = \begin{bmatrix} 0 & 0 & 0 & 0 \\ 0 & 0 & 0 & 0 \\ 0 & 1 & 1 & 0 \\ 1 & 1 & 0 & 1 \end{bmatrix} \quad (11)$$

As another example, the matrix $H_x$ and the X-filter matrix $DX(H_x)$ for the test response vector in Equation (5) is:

$$H_x = \begin{bmatrix} 1 \\ 0 \\ 1 \\ 1 \end{bmatrix}; DX(H_x) = \begin{bmatrix} 0 & 0 & 0 & 0 \\ 0 & 1 & 0 & 0 \\ 1 & 0 & 1 & 0 \\ 1 & 0 & 0 & 1 \end{bmatrix} \quad (12)$$

The construction of the X-filter matrix, and the X-filtering step itself, depends on the existence of x linearly independent expressions in $H_x$, where x is the number of unknowns in the corresponding test response vector. The structure and selection of the error correcting code guarantees that this is true for all x<d.

Using the X-filter matrix $DX(H_x)$, the X-filtering process on a compacted output vector s can be written as:

$$s_t = DX(H_x) \cdot s. \quad (13)$$

It is known that:

$$s = H \cdot t = H \cdot t_k + H \cdot t_e + H \cdot t_x. \quad (14)$$

Therefore:

$$s_t = DX(H_x) \cdot H \cdot t_k + DX(H_x) \cdot H \cdot t_e + DX(H_x) \cdot H \cdot t_x. \quad (15)$$

Because by construction, $$DX(H_x) \cdot H \cdot t_x = 0, \quad (16)$$

it follows that, $$s_t = DX(H_x) \cdot H \cdot t_k + DX(H_x) \cdot H \cdot t_e. \quad (17)$$

Based on the above, it has been established that when the number of unknowns is less than d, an X-filter matrix can be constructed for one or more unknown locations. This X-filter matrix can be used to produce a compacted output response $s_t$ that is independent of the unknown values.

Using this filtering procedure, it can also be shown that the compacted output vector $s_t$ obtained through exemplary embodiments of the X-filtering technique provide the same error correction and error detection capabilities as described in the second ECC theorem. In particular, consider a first lemma: for a given location of unknowns in a test response vector with the number of unknowns x<d, if $DX(H_x) \cdot a = 0$ for an m-bit vector, then there exists a value assignment $t_x$ to the unknowns such that $H \cdot t_x = a$. This can be proven by constructing a vector $t_x$ that satisfies the statement. With the unknowns as variables in $t_x$, $H \cdot t_x$ represents a set of m linear equations in x unknowns. Out of these m equations, there will be x linearly independent equations with the remaining m−x equations linearly dependent on these x equations. So, the x linearly independent equations can be solved for values of the unknowns to obtain the corresponding x bits in a. Because $DX(H_x) \cdot a = 0$ and keeping the construction of $DX(H_x)$ in mind, if these values of the unknowns are plugged into the remaining m−x linearly dependent equations, the remaining m−x bits of a can be obtained.

Now consider a second lemma: for a test response vector with x unknowns and e errors, where e+x<d, $DX(H_x) \cdot H \cdot t_e$ is non-zero. The second lemma can be proven as follows. First, assume that $DX(H_x) \cdot H \cdot t_e = 0$. Then, from the first lemma, there exists a value assignment to the unknowns $t_x$ such that $H \cdot t_x 32 H \cdot t_e$. From the first ECC theorem presented above, this implies that $t_x$ and $t_e$ belong to the same coset, which is a contradiction since the distance between $t_x$ and $t_e$ is less than d.

Finally, consider a third lemma: for a test response vector with x unknowns and e errors, where 2t+x<d, and for two different error patterns, $t_{e1}$ and $t_{e2}$, $DX(H_x) \cdot H \cdot t_{e1} \neq DX(H_x) \cdot H \cdot t_{e2}$. This can proven as follows. Assume that $DX(H_x) \cdot H \cdot t_{e1} = DX(H_x) \cdot H \cdot t_{e2}$. This implies: $DX(H_x) \cdot H \cdot (t_{e1} + t_{e2}) = 0$. So, from the first lemma, there exists a value assignment to the unknowns $t_x$ such that $H \cdot t_x = H \cdot (t_{e1} + t_{e2})$, which means that $t_x$ and $t_{e1} + t_{e2}$ belong to the same coset (from the first ECC theorem). However, since 2t+x<d, the distance between $t_x$ and $t_{e1} + t_{e2}$ is less than d and therefore there exists a contradiction.

Embodiments of the exemplary X-filtering technique described above can remove the dependence of the compacted output on the value of the unknowns in the test response while preserving the desirable error correction and detection capabilities of compaction schemes using error correcting codes.

III. Implementing the X-Filter

FIG. 9 is a schematic block diagram illustrating an exemplary configuration 900 of a compactor and an X-filter hardware block. In particular, scan chain outputs 910 provide n-bit test response vectors 910 (n×1 vectors) to the compactor 920 (for example, a compactor implementing a compaction scheme according to an error correcting code as described above). The compactor 920 produces m-bit compacted test response vectors 922, which are provided to an X-filter block 930. In the illustrated embodiment, the X-filter block 930 is a reconfigurable or programmable X-filter block configured to filter zero, one, or more unknown values from the compacted outputs on a vector-by-vector, cycle-by-cycle, or other basis. For example, the X-filter block 930 can be applied to remove the effects of any unknown values that are present in an m-bit compacted test response vector 922 so that one or more errors can be detected in the filtered response. For instance, the X-filter block 930 can operate to combine two or more values of the compacted test response vector known to be dependent on a common unknown test value. The X-filter block 930 can be controlled by control signals 940 so that it performs the desired filtering function. The control signals 940 can be provided, for example, from an external tester (for example, ATE) as the test responses are shifted out of the scan chains. The control signals 940 can, in certain embodiments, be provided at substantially same time as the shifting out occurs, or stored for some period of time on the circuit-under-test (for example, using one or more registers coupled between the tester and the X-filter block 930). Furthermore, the control signals 940 can be stored in a compressed format on the external tester and decompressed by on-chip decompression hardware once transferred to the circuit-under-test. The X-filter block 930 outputs a filtered output vector 932, wherein one or more errors that would have otherwise been masked by an unknown value can be detected. In the illustrated embodiment, the X-filter block is located on the same chip as the compactor 920, but may be located elsewhere (for example, on a different chip than the compactor on a multi-chip module).

To execute X-filtering according to one exemplary embodiment, two sets of information are used by the X-filter block 930 during a scan-out shift cycle: (1) information concerning which rows of $H_x$ are linearly independent and which are linearly dependent; and (2) information concerning what the dependence relations of the linearly dependent rows on the linearly independent rows are. This information can be precomputed and stored, for example, on the tester. In one particular embodiment, the information is stored using mx-bits per unknown distribution in the test response vector. For instance, for each row of $H_x$, an x-bit vector is stored that indicates whether the corresponding row is linearly independent or how it is dependent on the linearly independent rows. In one particular implementation, these x-bit vectors can be determined using a method such as the method defined by the exemplary pseudocode in Table 1 below:

TABLE 1

Exemplary Method for Computing a Control Matrix

| | |
|---|---|
| li_count = 0 | /* LINEARLY INDEPENDENT ROWS FOUND COUNTER */ |
| LI = 0 | /* ARRAY TO STORE LINEARLY INDEPENDENT ROWS */ |
| V = 0 | /* ARRAY TO STORE m, x-BIT VECTORS THAT GO ON TESTER */ |

$I_x$ = x × x Identity Matrix
for (row = 0 to m−1)
    if ($H_x$[row] is linearly independent of rows in LI)
        LI[li_count] = $H_x$[row]
        V [row] = $I_x$[li_count]
        li_count++
    else
        V [row] = Array defining relation of $H_x$[row] to the linearly independent rows in LI To illustrate the operation of the examplary method shown in Table 1, consider a hypothetical parity check matrix $H_x$ for three unknowns:

$$H_x = \begin{bmatrix} 0 & 0 & 0 \\ 1 & 0 & 1 \\ 1 & 0 & 1 \\ 0 & 1 & 1 \\ 1 & 0 & 0 \\ 1 & 1 & 1 \end{bmatrix}. \quad (18)$$

A corresponding control matrix V that can be stored on the tester and computed according to the exemplary pseudocode comprises:

$$V_x = \begin{bmatrix} 0 & 0 & 0 \\ 1 & 0 & 0 \\ 1 & 0 & 0 \\ 0 & 1 & 0 \\ 0 & 0 & 1 \\ 0 & 1 & 1 \end{bmatrix} \quad (19)$$

According to the implementation illustrated in FIG. 9, the X-filtering block 930 will receive these m, x-bit vectors to perform X-filtering on the compacted test response vectors output from the ECC-based compactor 920.

The X-filtering block 930 can be implemented in several ways. However, in one particular implementation, a cell-based design (for example, an iterative-logic-array based design) is used that can be extended for any value of m and x just by using more cells. Although not required, exemplary cell-based designs desirably can be based on relatively simple logic cells, which can be stacked together to achieve the desired functionality. In one particular embodiment, for example, m identical cells are used, each of whose complexity depends on x.

A block diagram of an example cell 1000 is shown in FIG. 10. The example cell 1000 has two sets of x-bit inputs (F and L), and, two sets of x-bit outputs (F' and L') which can be input into the next cell. In addition, the example cell 1000 also inputs one bit(s) of the compacted test response vector from the compactor and corresponding x bits from the control matrix V. The cell 1000 outputs a filtered bit ($s_r$). In the illustrated embodiment, the input set F is a set of flags indicating the linearly independent rows encountered so far. For example, the set F that is input into the first cell can be all zeros. When the first linearly independent compacted test response bit is encountered at a cell (for example, as indicated by 10 . . . 0 on the V input), the corresponding $f_0$ bit in F can be set to "1" and, in certain embodiments, remains at "1" through the subsequent cells. Similarly, $f_1$ can be set to "1" when the second linearly independent row is encountered, and so on. In the illustrated embodiment, the set L carries the values of the linearly independent compacted test response bits encountered so far. Thus, for example, the values in the set L for the first cell can be all zeros, and, when the first linearly independent compacted test response bit is encountered, the $l_0$ bit in the set L can become the value of the corresponding compacted test response bit s.

Figure 11:
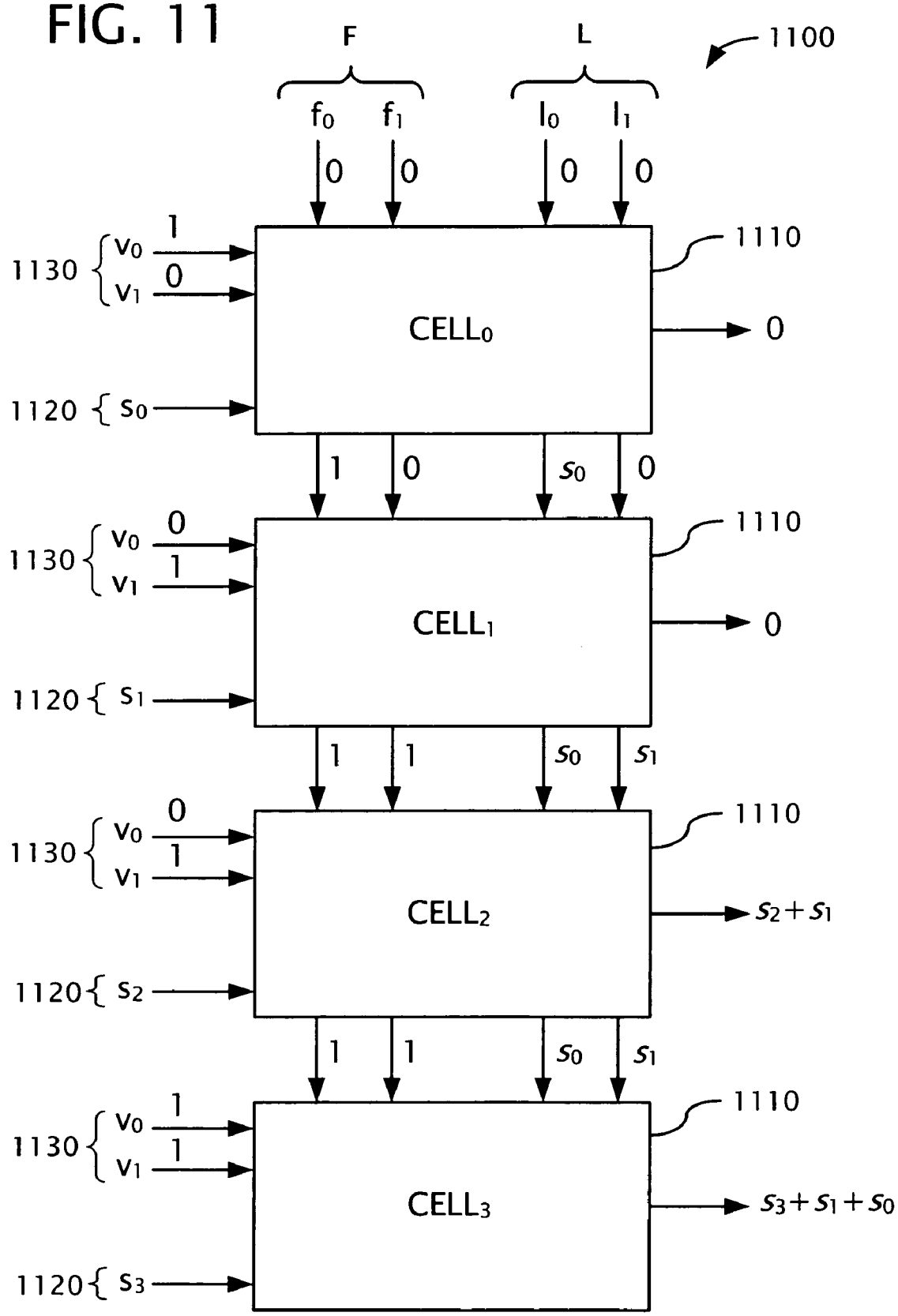
FIG. 11 is a schematic block diagram of four filtering cells as may be used, for example, in the filtering hardware of FIG. 9 and illustrating the filtering of the exemplary test response vector shown in Equation (2).

An example of a series of X-filtering cells configured to filter the test response vector introduced above with respect to Equation (2) is shown in FIG. 11. In particular, FIG. 11 is a block diagram 1100 showing four cells 1110 ($Cell_0$, $Cell_1$, $Cell_2$, and $Cell_3$, respectively) configured to input respective bits 1120 ($s_0$, $s_1$, $s_2$, $s_3$) of the compacted test response vector. The cells 1110 are controlled by control values 1130, which are determined according to the control matrix V. In this example, for instance, the parity check matrix $H_x$ and control matrix V corresponding to the test response vector given in Equation (2) are:

$$H_x = \begin{bmatrix} 0 & 1 \\ 1 & 0 \\ 1 & 0 \\ 1 & 1 \end{bmatrix}; \quad V = \begin{bmatrix} 1 & 0 \\ 0 & 1 \\ 0 & 1 \\ 1 & 1 \end{bmatrix} \quad (20)$$

In the illustrated example, the F and L sets are input first into $Cell_0$ and are coupled to the subsequent cells along a path through $Cell_1$, $Cell_2$, and $Cell_3$. In this exemplary embodiment, the initial state of set F (whose values indicate whether a linearly independent compacted test response bit has been encountered along the path of cells) is "0", though in other embodiments, the initial state could be "1". Likewise, the initial state of set L (whose values correspond respectively to the linearly independent compacted test response values as they are encountered) is "0", though in other embodiments, the initial state could be "1."

In the illustrated embodiment, the set of control values 1130 ($v_0$, $v_1$) corresponding to $Cell_0$ is (1, 0). Because $Cell_0$ is the first cell in the series where $v_0$ is "1" (as indicated by $f_0$ being "0"), $Cell_0$ treats the compacted value $s_0$ as a linearly independent value and sets $f_0$ to "1" and $l_0$ to "$s_0$." The updated F and L sets are output from $Cell_0$ and passed to $Cell_1$. In the exemplary configuration, $Cell_0$ outputs a null value (for example, "0") as the corresponding bit of the filtered output. For $Cell_1$, the control values ($v_0$, $v_1$) are (0, 1). Because $Cell_1$ is the first cell in the series where $v_1$ is "1" (as indicated by $f_1$ being "0"), $Cell_1$ treats the compacted value $s_1$ as another linear independent value and sets $f_1$ to "1" and $l_1$ to "$s_1$." $Cell_1$ also outputs a null value as the corresponding bit of the filtered output and outputs the updated F and L sets to $Cell_2$. For $Cell_2$, the set of control values is (0, 1). Because $Cell_2$ is the second cell in the series where $v_1$ is "1" (as indicated by $f_1$ now being "1"), $Cell_2$ operates to logically combine the compacted value $s_2$ with the value of $l_1$ (which here correspond to $s_1$). For example, in the illustrated configuration, the values can be combined through an XOR gate, resulting in a filtered output value of "$s_2+s_1$." In this example, the F and L sets are not updated any further. For $Cell_3$, the set of control values is (1, 1). Because $Cell_3$ is not the first cell in the series where $v_0$ or $v_1$ are "1" (as indicated by $f_0$ and $f_1$ both being "1"), $Cell_3$ operates to combine (for example, via XOR gates) the compacted value $s_3$ with both $l_0$ (which corresponds to $s_0$) and $l_1$ (which corresponds to $s_1$). In the illustrated configuration, the filtered output value that results is "$s_3+s_1+s_0$." Thus, the full filtered response is (0, 0, $s_2+s_1$, $s_3+s_1+s_0$), which corresponds to the filtered output $s_f$ described above in Equation (7).

Figure 12:
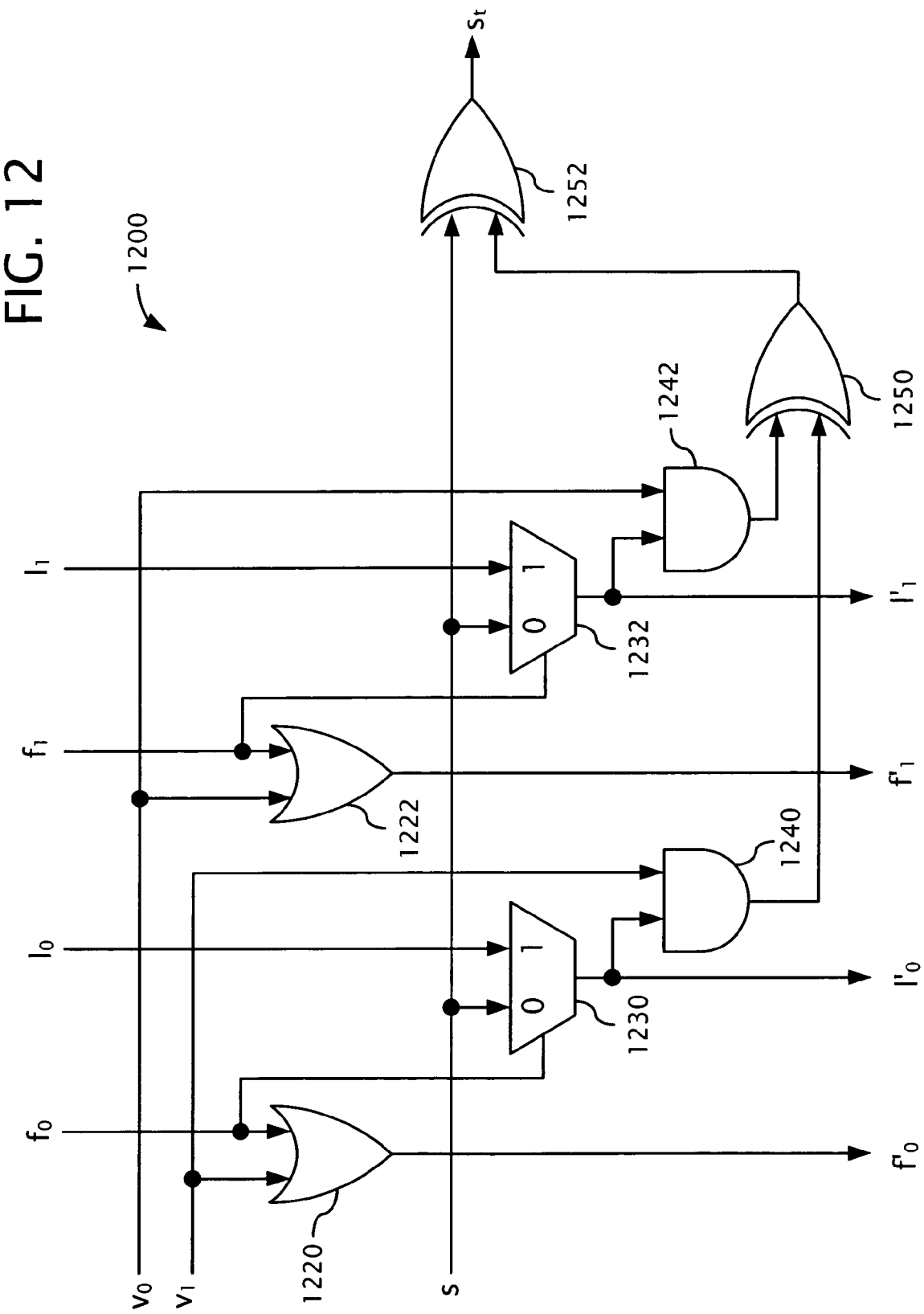
FIG. 12 is a schematic block diagram illustrating an exemplary circuit architecture as may be used to implement a filtering cell as in FIG. 10 or 11 and configured to remove the effects of up to two unknown values.

Based on the functionality of the cell-based implementation described above with respect to FIGS. 10 and 11, the logic inside the cell can be derived and configured in a variety of manners. For example, one exemplary logic configuration for a cell is illustrated in FIG. 12. In particular, cell 1200 is a programmable filtering cell operable to remove the effects of up to two unknown values from a compacted test response vector, though it may alternatively be configured to remove only one unknown value or more than two unknown values depending on the implementation. In the illustrated implementation, for example, OR gate 1220 inputs $v_0$ and $f_0$ and outputs $f'_0$. Thus, if $f_0$ is initially low, $f'_0$ can be set high when $v_0$ is high and will remain high as the $f_0$ value is passed through subsequent cells. OR gate 1222 performs this functionality for $v_1$, $f_1$, and $f'_1$, respectively. Multiplexer (MUX) 1230 is controlled by $f_0$ and is used to determine whether $l_0$ should be either the value $l_0$ input from the previous cell or the corresponding compacted test response bit s input into the cell. MUX 1232 performs this functionality for $l_1$ and $l'_1$. AND gate 1240 receives the output of the MUX 1230 and the value of $v_0$ and passes the output of the MUX 1230 through if $v_0$ is high. AND gate 1242 performs this functionality for the output of MUX 1232 and the value of $v_1$. XOR gate 1250 logically combines the values of $l_0$ and $l_1$ when the corresponding compacted output value s is a linear combination of the both $l_0$ and $l_1$ (for example, both $v_0$ and $v_1$ are high), or passes either the value of $l_0$ or $l_1$ through if s is only a linear combination of one of $l_0$ or $l_1$ (for example, only one of $v_0$ and $v_1$ is high), or stays low if s is not a linear combination of either $l_0$ or $l_1$ (for example, both $v_0$ and $v_1$ are low). XOR gate 1252 logically combines the output value s with the output from the XOR gate 1250 and provides a filtered output value $s_f$.

An X-filter block using cells configured according to the exemplary implementation shown in FIG. 12 has the following hardware requirements: mx 2-input OR gates, mx 2-input AND gates, mx 2-input XOR gates and mx 2-input MUXes. Several variations and optimizations to the above implementation of the X-filtering cell are possible, but the hardware requirements for this exemplary configuration will be referred to as O(mx).

Figure 17:
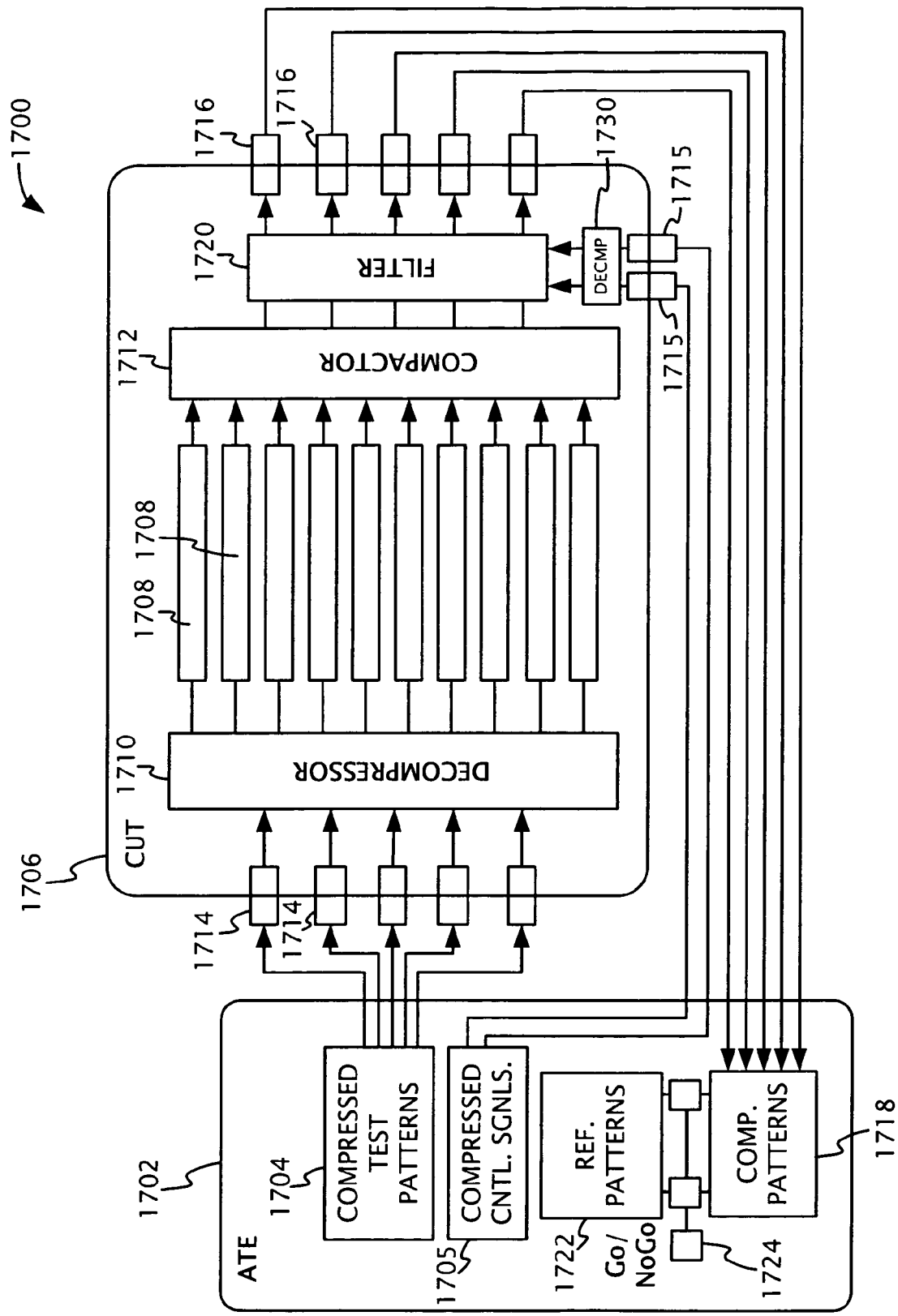
FIG. 17 is a schematic block diagram of an exemplary system for testing digital circuits using embodiments of the disclosed filtering hardware.

FIG. 17 shows an example of a system 1700 for testing digital circuits using any of the filtering embodiments described herein. In particular, FIG. 17 is a block diagram showing external automated test equipment ("ATE") or a tester 1702 configured to apply a set of compressed test patterns 1704 and compressed filter control signals 1705 to a CUT 1706 via test input pins 1714 and control pins 1715. The compressed control signals are input into a decompressor 1730, which decompresses the compressed control signals that are input into the filter 1720. (It should be noted that the decompressor 1730 does not need to be separate and in certain exemplary embodiments can be merged with the main decompressor 1710.) The compressed test patterns are input into a decompressor 1710, which decompresses the compressed test patterns into the test patterns that are applied to the scan chains 1708 within the CUT 1706. For example, the test patterns can comprise a number of deterministically specified bits targeting one or more defects ("deterministic test patterns"). After a test pattern is launched and its respective test response captured, the test response is clocked out of the scan chains 1708 and into the compactor 1712. The compactor 1712 can be any suitable compactor, such as a spatial compactor or finite memory compactor. A filter 1720 is coupled to the outputs of the compactor 1712 and is configured to receive the compacted test responses output from the compactor 1712. The filter 1720 can be any filter as described herein. For example, the filter 1720 may comprise multiple X-filtering cells as described above with respect to FIGS. 10 and 12. In some embodiments, the filter 1720 is not coupled to all outputs of the compactor 1712, but only a portion of the outputs. Further, multiple independent compactors may be present in the CUT 1706, and one or more filters 1720 may be coupled respectively to one, some, or all of the compactors. The illustrated filter 1720 operates in response to the control signals decompressed by decompressor 1730 from the compressed data input at the control pins 1715. For example, in some embodiments and as in FIGS. 10 and 12, the control bits are indicative of bits in at least one of the compacted test response vectors that depend from one or more unknown test values, and the filter 1720 operates to logically combine the bits, thereby removing the dependency of the bits on the unknown test values. In the illustrated embodiment, filtered test responses are output from the filter 1720 and routed back to the tester 1702 through output test pins 1716. The tester 1702 compares the filtered test responses 1718 to expected, fault-free, versions 1722 of the filtered test responses (determined, for example, during automatic test pattern generation (ATPG)). From this comparison, a determination can be made as to whether the CUT 1706 is operating as expected (for example, producing a "go" signal at node 1724), or is not operating as expected (for example, producing a "no go" signal at the node 1724).

Figure 18:
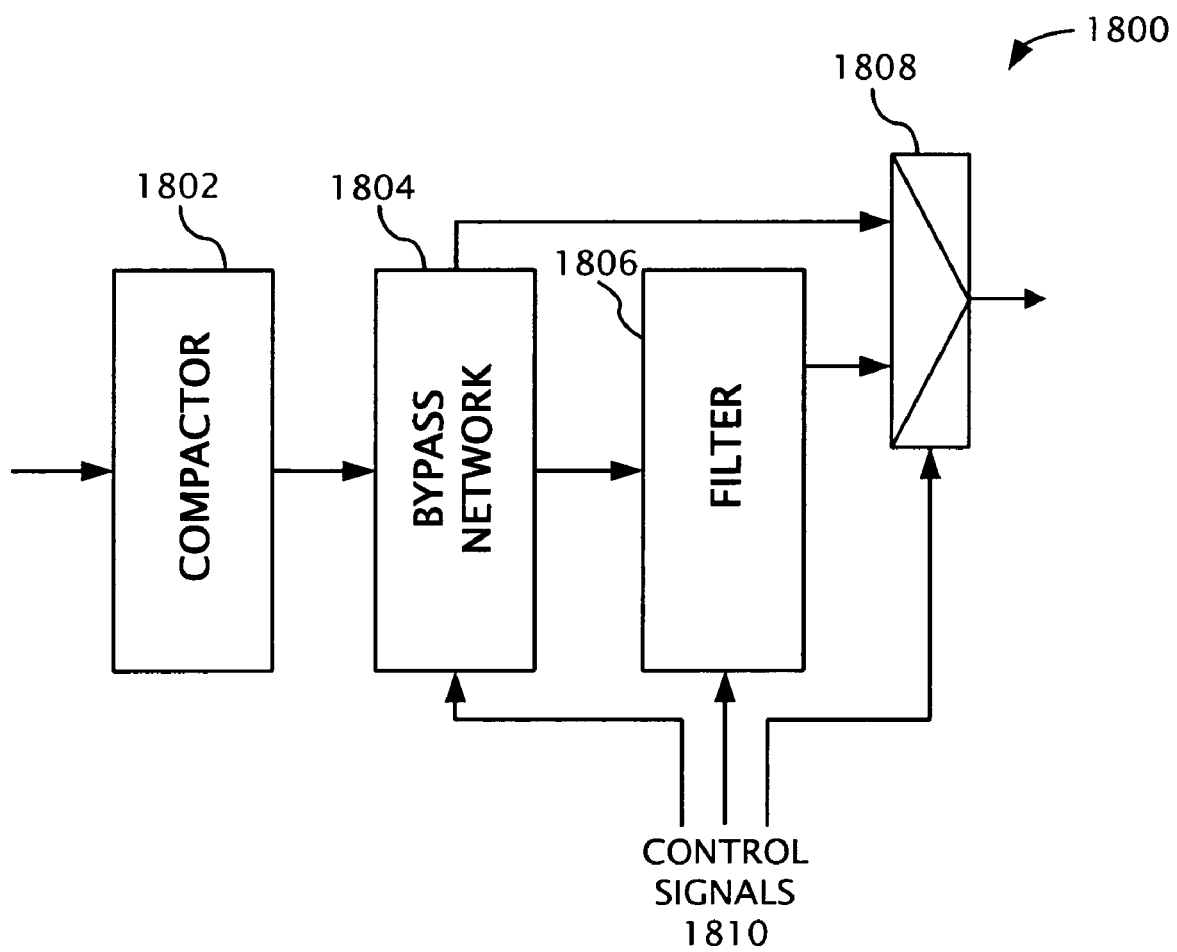
FIG. 18 is a schematic block diagram illustrating an exemplary configuration of a compactor, a bypass network coupled to the compactor, and filtering hardware coupled to the bypass network.

In some implementations, a bypass network is used to selectively route one or more compacted test responses or test response values around the filter. Such a bypass network may be used, for example, if a test response (or portion of a test response) has no unknown values to be filtered. An example of such a bypass system is shown in FIG. 18. In particular, FIG. 18 is a block diagram 1800 showing a compactor 1802 having outputs coupled to a bypass network 1804. The bypass network 1804 can comprise a network configured to selectively route one or more values output from the compactor 1802 to either an output multiplexer 1808 or a filter 1806 in response to one or more corresponding control signals 1810. The filter 1806 can comprise, for example, any of the X-filter embodiments described herein. The output multiplexer 1808 is configured to selectively output the desired compacted test response values, filtered test response values, or combinations thereof in response to one or more corresponding control signals 1810. In one exemplary implementation, the bypass network 1804 operates without control signals and comprises branches respectively routing values from the compactor outputs to both the filter 1806 and the output multiplexer 1808. In such an implementation, the bypassing operation can be controlled using one or more control signals at the output multiplexer 1808. For example, a one-bit control signal can be used to control the output multiplexer 1808 to select whether all of the test response values output from the compactor during a particular time frame (a test response vector) should bypass the filter 1806.

IV. Implementations of X-Filter for Special Cases

In this section, two example cases are described which can have a more efficient implementation than the embodiments described above. In both of these cases, the decreased hardware overhead results from certain properties that the codes used to construct the compactors have. For the first example, consider the construction of an X-filter for an extended-Hamming-code based compactor that can tolerate at most one unknown (x=1). One possible construction for a $(2^{m-1}, m, 4)$ extended Hamming code is:

$$\text{Row} \quad\quad\quad\quad\quad\quad\quad\quad\quad\quad\quad\quad\quad\quad\quad\quad (21)$$
$$\begin{array}{c} 0 \\ 1 \\ 2 \\ \vdots \\ \vdots \\ (m-2) \\ (m-1) \end{array} \begin{bmatrix} 0 & 1 & 0 & 1 & & & 1 \\ 0 & 0 & 1 & 1 & & & 1 \\ 0 & 0 & 0 & 0 & \cdots \text{All } 2m-1 \cdots & 1 \\ \vdots & \vdots & \vdots & \vdots & (m-1)\text{-bit vectors} & \vdots \\ \vdots & \vdots & \vdots & \vdots & & \vdots \\ 0 & 0 & 0 & 0 & & & 1 \\ & & & & \text{Complement of Row 0} & \end{bmatrix}$$

Because the last row is the complement of the first row, it is known that if there is an unknown $X_0$ in a test response vector, $s_0+s_{m-1}$ will be dependent on $X_0$. Consequently, just m−2 additional inputs are needed to inform the X-filter of what other compacted bits are dependent on $X_0$ so that $X_0$ can be filtered out. Accordingly, for compactors configured according to this type of error correction code, two fewer inputs can be used in comparison to the exemplary configuration described above with respect to FIG. 12.

As a second example, consider the use of a code to construct a compactor which can tolerate one, two, or any odd number of errors when no unknowns are present and one error in the presence of one unknown. This example illustrates a more generalized application of X-filtering beyond the configurations discussed above. In this example, the parity check matrix for the code can consist of m rows, where m is a multiple of 4, and two groups of columns: $H_0$ and $H_e$. The group $H_e$ contains all m-bit vectors with m/2 ones and the group $H_0$ contains all m-bit vectors with (m/2)−1 ones. Therefore, the total number of columns for this code will be:

$$n = \binom{m}{m/2} + \binom{m}{m/2+1}. \quad\quad (22)$$

An example for m=4 is:

$$H = [H_0 \mid H_e] = \begin{bmatrix} 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{bmatrix} \quad\quad (23)$$

Note that all the columns in $H_e$ have an even number of "1"s, and all the columns in $H_0$ have an odd number of "1". For this reason, this type of code is sometimes referred to herein as an "even/odd" code. One can easily verify that this code will detect one, two, or any odd number of errors in the absence of unknowns. For example, when one unknown is present, there are at least two possible scenarios. In the first scenario, the location of the unknown corresponds to a column in $H_0$. In this case, because the number of "1"s in the columns in $H_0$ is always one less than the number of "1"s in the columns in $H_e$, a single error in any location can be detected without any X-filtering. In the second scenario, the location of the unknown corresponds to a column in $H_e$. In this case, errors in certain locations corresponding to columns in $H_O$ may get hidden behind the unknown and will not be detected at the output pins. As an example using the above parity matrix, if the unknown location corresponds to the first column in $H_e$, then an error in the location corresponding to the first column or the second column of $H_O$ will not be detected in the compacted output bits. In order to remedy this situation, a filter can be constructed that takes the sum of all compacted output bits ($s_{sum}$) and combines the resulting sum to the respective compacted output bits.

Figure 13:
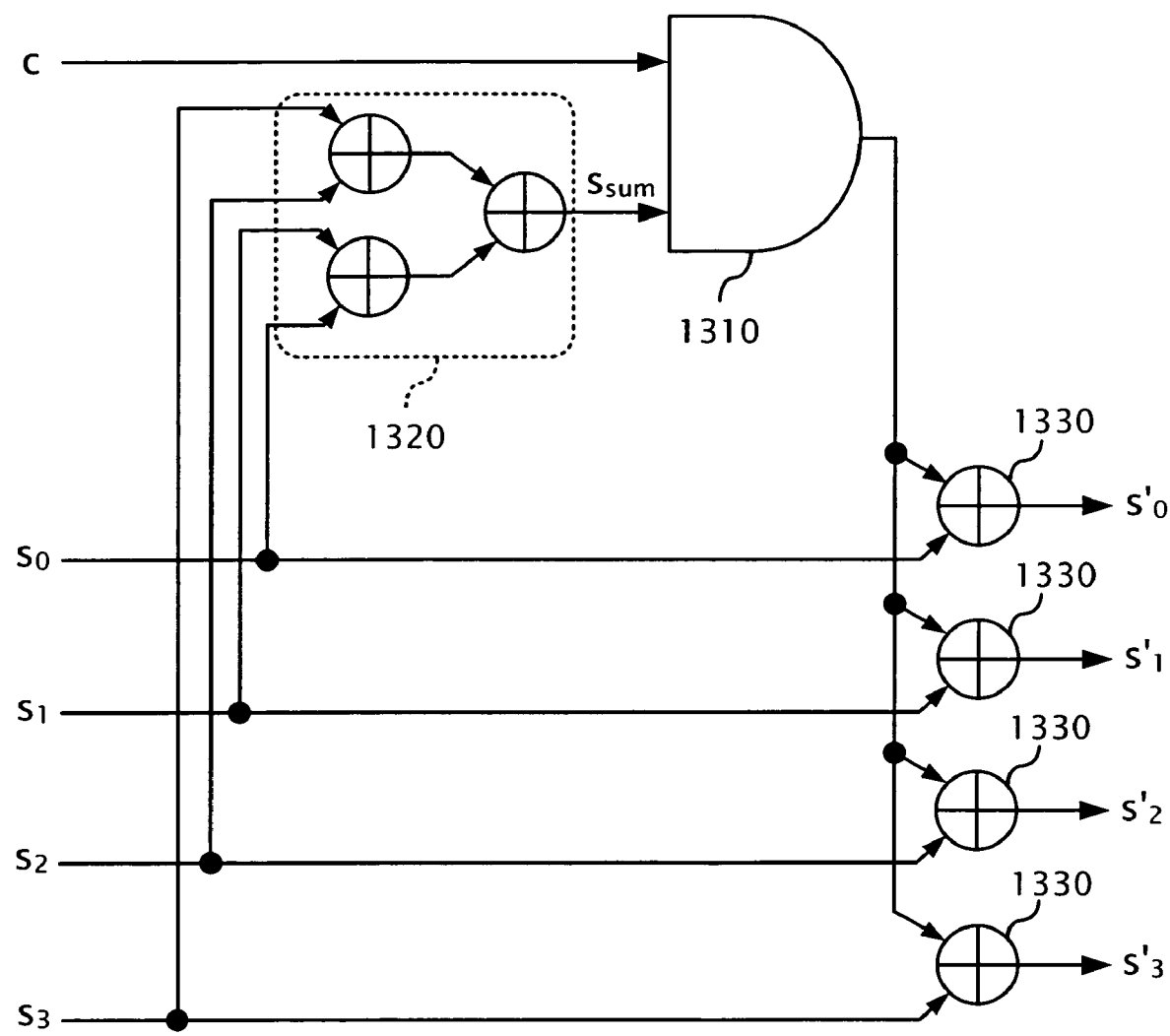
FIG. 13 is a schematic block diagram illustrating an exemplary circuit architecture for implementing filtering hardware in connection with an exemplary extended-Hamming-code-based compactor.

An exemplary filter configuration for performing this operation is shown in FIG. 13 for the case of m=4. In the filter embodiment 1300 shown in FIG. 13, the control input c is "1" when there is an unknown with a location corresponding to a column in $H_e$. Consequently, AND gate 1310 passes the output from the XOR network 1320 ($s_{sum}$) to the XOR gates 1330, which are configured to respectively combine the value $s_{sum}$ with the compacted output bits. If there is not an unknown value in a location corresponding to a column in $H_e$, then the control input c is "0". In this particular embodiment, control input c is the only input required for the filter 1300.

In general, and according to this exemplary configuration, when the location of the unknown value corresponds to a column in $H_e$, the sum $s_{sum}$ will be independent of the value of the unknown but dependent on an error in a location corresponding to a column in $H_O$. Moreover, if the error location corresponds to a column in $H_O$, there exists at least one output bit which is independent of both the error and the unknown. Thus, an error which might have been masked by unknowns will now appear on an output bit. Therefore, in this example, an error can be detected in the presence of an unknown using a filter that uses only a single input.

V. Experimental Results

In this section, several parameters and results associated with exemplary compaction schemes based on two well-known error correcting codes and using embodiments of the filtering techniques described above are presented. The two exemplary compaction schemes are based on the distance-4 extended Hamming code and the distance-5 BCH codes. Further, the special technique using so-called "even/odd" codes and discussed above with respect to FIG. 13 was considered. The results are given in Table 2 and Table 3.

In Table 2, the exemplary compaction schemes were selected to be similar in compaction ability to those given in S. Mitra and K. S. Kim, "X-Compact: An Efficient Response Compaction Technique," *IEEE Trans. CAD*, Vol. 23, Issue 3, pp. 421-432, March 2004. In Table 3, some examples are presented of more powerful compaction schemes possible with X-filtering. The first four columns in both the tables list the following parameters concerning the compaction schemes: the maximum number of scan chains supported, the maximum number of unknowns tolerated, the maximum number of errors that are guaranteed detection, and the maximum number of errors guaranteed correction. The next three columns list the following parameters concerning the exemplary X-filtering-based compactors used to perform the desired compaction: the error correcting code used for compaction, the number of output pins, and the number of control inputs to the X-filter. The last column in Table 2 gives the number of output pins required for an equivalent X-compact scheme.

TABLE 2

Examples of X-filter Compaction Schemes Compared with X-Compact

| Compaction Scheme Parameters | | | | X-Filter-Based Compaction | | | X-Compact |
| --- | --- | --- | --- | --- | --- | --- | --- |
| # of SC (n) | Max. # of Xs (x) | Error Detection | Error Correction | ECC Code | # Out. Pins (m) | # Ctrl. Bits | # Out. Pins (m) |
| 126 | 1 | 2 − x | 0 | Even/Odd | 8 | 1 | 9 |
| 1716 | 1 | 2 − x | 0 | Even/Odd | 12 | 1 | 13 |
| 512 | 1 | 3 − x | 1 | Extended Hamming | 10 | 8 | 18 |
| 2048 | 1 | 3 − x | 1 | Extended Hamming | 12 | 10 | 22 |

TABLE 3

Additional Examples of X-filter Compaction Schemes

| Compaction Scheme Parameters | | | | X-Filter-Based Compaction | | |
| --- | --- | --- | --- | --- | --- | --- |
| # of SC (n) | Max. # of Xs (x) | Error Detection | Error Correction | ECC Code | # Out. Pins (m) | # Ctrl. Bits |
| 512 | 2 | 3 − x | 1 if x ≦ 1 | Extended Hamming | 10 | 20 |
| 511 | 1 | 4 − x | 2 | BCH | 18 | 18 |
| 511 | 2 | 4 − x | 2 if x ≦ 1<br>1 if x ≦ 2 | BCH | 18 | 36 |

It can be seen from Table 2 that the disclosed filtering technology uses far fewer output pins as compared to the X-compact scheme in most cases. Further, in the reported cases, the number of output pins plus the number of control bits is equal to the number of output pins required in the X-compact scheme. Using input control bits rather than outputs can be advantageous, since the control data that is used to control the X-filter can be compressed using techniques similar to those used for test data compression. For example, many shift-out cycles may not involve any unknown values. Thus, the data used to control the X-filter may be largely redundant (for example, mostly or all zeros), and thus can be compressed. Further, the codes in the above examples are capable of detecting more errors in special cases than are listed in the table. For instance, any odd number of errors can also be detected.

VI. Exemplary Computing Environments

Figure 14:
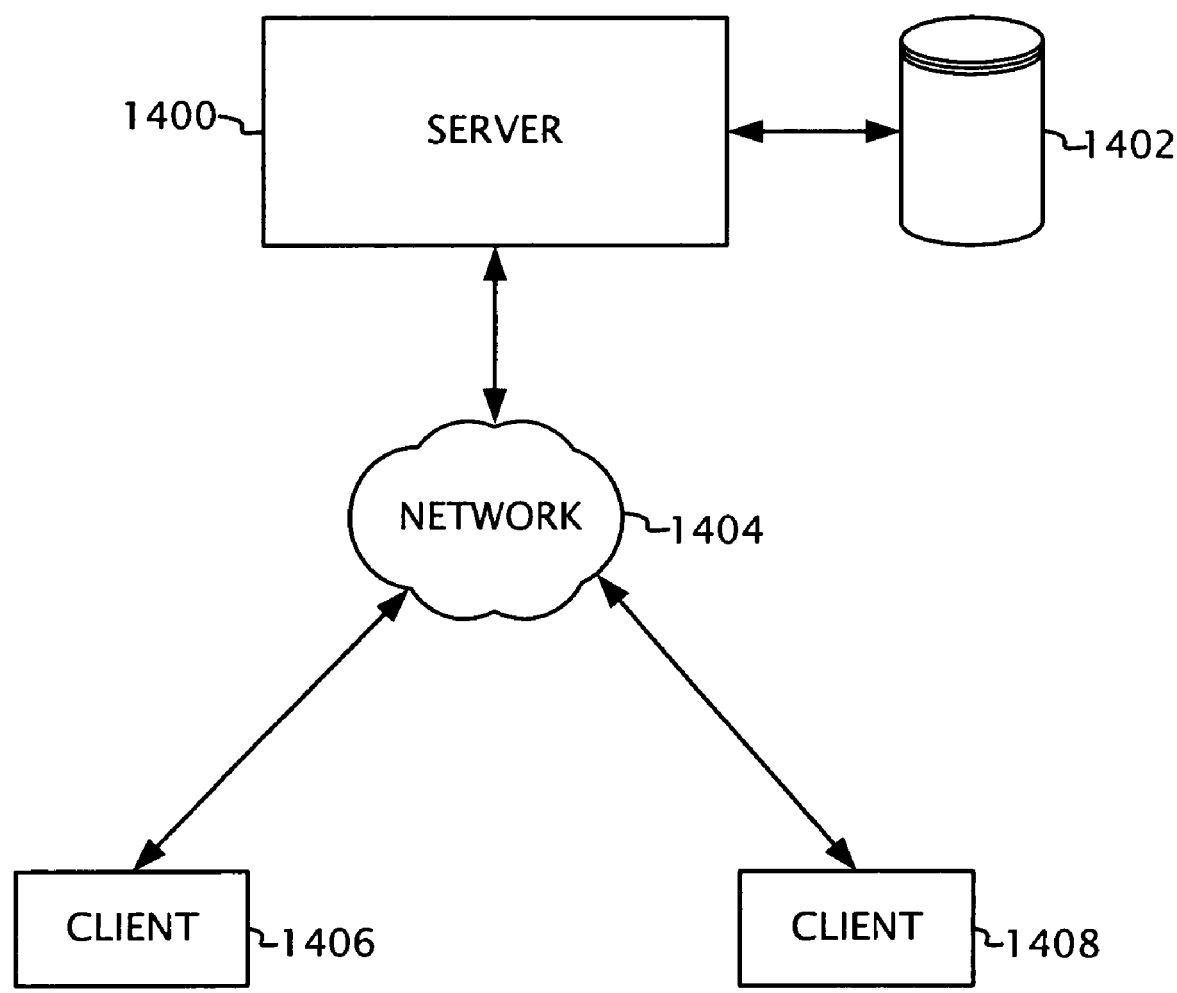
FIG. 14 is a schematic block diagram illustrating an exemplary circuit architecture for implementing filtering hardware in connection with an exemplary even/odd-code-code compactor.

Any of the aspects of the technology described above may be performed or designed using a distributed computer network. FIG. 14 shows one such exemplary network. A server computer 1400 can have an associated storage device 1402

(internal or external to the server computer). For example, the server computer 1400 can be configured to design compactor or filtering components according to any of the embodiments described above (for example, as part of an EDA software tool, such as a design, verification, or simulation tool). The server computer 1400 may be coupled to a network, shown generally at 1404, which can comprise, for example, a wide-area network, a local-area network, a client-server network, the Internet, or other such network. One or more client computers, such as those shown at 1406, 1408, may be coupled to the network 1404 using a network protocol.

Figure 15:
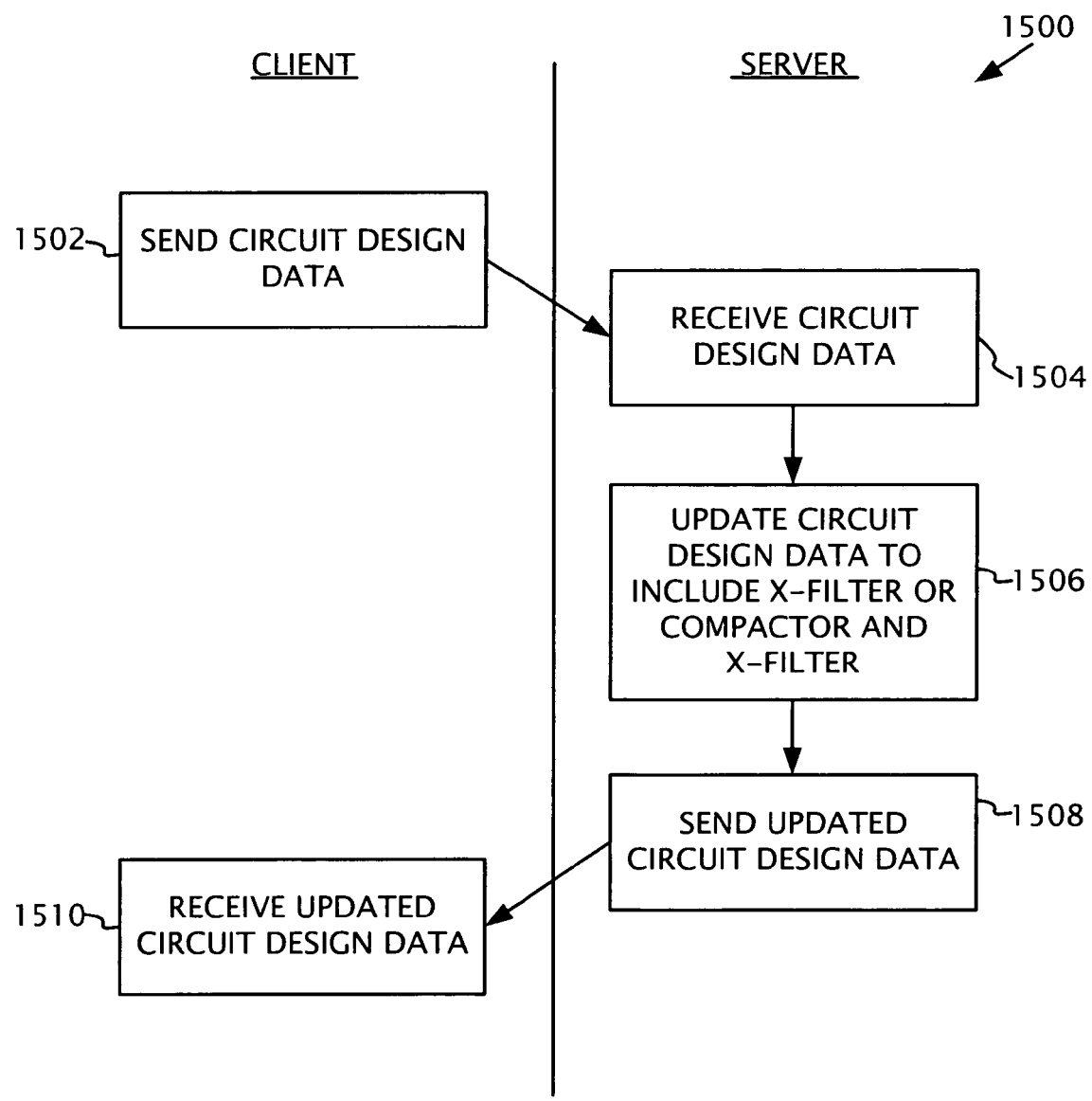
FIG. 15 is a block diagram showing an exemplary computer network as may be used to perform any of the disclosed methods.

FIG. 15 is a block diagram 1500 showing that a database containing circuit design information (for example, a netlist or an HDL file, such as a Verilog file) may be updated to include circuit design information for a compactor and/or filter architecture according to any of the embodiments disclosed herein using a remote server computer, such as the server computer 1400 shown in FIG. 14. In process block 1502, for example, the client computer sends circuit design data relating to a circuit having scan chains that capture test responses that are to be compacted and filtered using any of the disclosed compaction and/or filtering architectures. For instance, the client computer may send a netlist, HDL file, or other EDA design database or data structure. In process block 1504, the circuit design data is received and loaded by the server computer. In process block 1506, the circuit defined by the circuit design data is updated to include a compactor and/or filtering architecture according to any of the disclosed embodiments. An updated version of the circuit design data can then be created. The updated circuit design data can be stored as an updated version of the original design data, or in one or more separate databases or data structures. In process block 1508, the server computer sends the updated design data to the client computer, which receives the data in process block 1510. It should be apparent to those skilled in the art that the example shown in FIG. 15 is not the only way to update circuit design data to include the relevant design data. For instance, the current design data may be stored on one or more tangible computer-readable media that are not on a network and that are sent separately to the server (for example, on one or more compact disks, DVDs, portable memory devices, or portable hard drives). Or, the server computer may perform only a portion of the design procedures.

Having illustrated and described the principles of the disclosed technology, it will be apparent to those skilled in the art that the disclosed embodiments can be modified in arrangement and detail without departing from such principles. Further, embodiments of the disclosed technology can be configured to exhibit any single feature or combination (or subcombination) of features described herein. For example, in certain embodiments, the filter hardware is used to remove effects of test response values that are not necessarily unknown values.

Further, any one or more of the following features can be realized (either individually or in combination with one another) in embodiments of the X-filtering techniques. Certain embodiments of the X-filtering technique enable the use of "off-the-shelf" error correcting codes for compaction without requiring any special ATE support or data post processing. Such embodiments can also preserve the error correction and detection capabilities of the codes. The flexibility of using off-the-shelf ECCs allows one to construct compaction schemes that tolerate multiple unknown test values and that enable the detection and correction of multiple errors. For example, embodiments of the disclosed filter architectures can be used to eliminate the dependency of values in the compacted response on up to x unknowns as long as x<d. The disclosed techniques and architectures can also preserve the error detection capabilities of up to e errors where e+x<d and error correction capabilities of up to t errors where $t<\lfloor (d-x)/2 \rfloor$.

Further, the hardware used to implement the filter embodiments can have O(mx) complexity and, in certain implementations, can operate using mx inputs, where m is the number of bits in the compacted output response and x is the maximum number of unknowns that are desirably tolerated per scan shift cycle. Certain embodiments of the filtering hardware are independent of the location of the unknowns in the test response and depend only on the number of unknowns that are desirably tolerated. Likewise, certain embodiments of the X-filtering hardware are independent of the error correcting code used for compaction.

Moreover, some embodiments of the disclosed filtering technology do not require an increase in the number of output pins over those required by the compactor itself. Thus, achieving output compaction by using inputs (control pins) rather than output pins is another possible feature of the disclosed technology. Further, in some embodiments of the disclosed technology, the control data that is used to control certain filter embodiments can be stored in a compressed form on an external tester (for example, ATE) and decompressed using one or more on-chip decompressors. The control data can typically be compressed because it usually contains many redundant values. This redundancy is a consequence of the fact that unknown values are typically found in the compacted test response during only a few shift cycles. Using input pins (control pins) rather than output pins also allows more devices to be tested in parallel using the same external resources.

Because compactors designed according to error correcting codes can allow for powerful error correction capabilities, some embodiments of the disclosed techniques are capable of extending powerful diagnosis support during production testing, and do not necessarily require a bypass mode for diagnosis. This aspect of the disclosed technology can be useful in yield learning environments where the failure data collected during production testing is often used as part of a continuous yield learning program, which is becoming common with 90 nm and later technologies. Furthermore, the number of control pins can, in some embodiments, be further reduced when special ECC code characteristics are considered.

Figure 19:
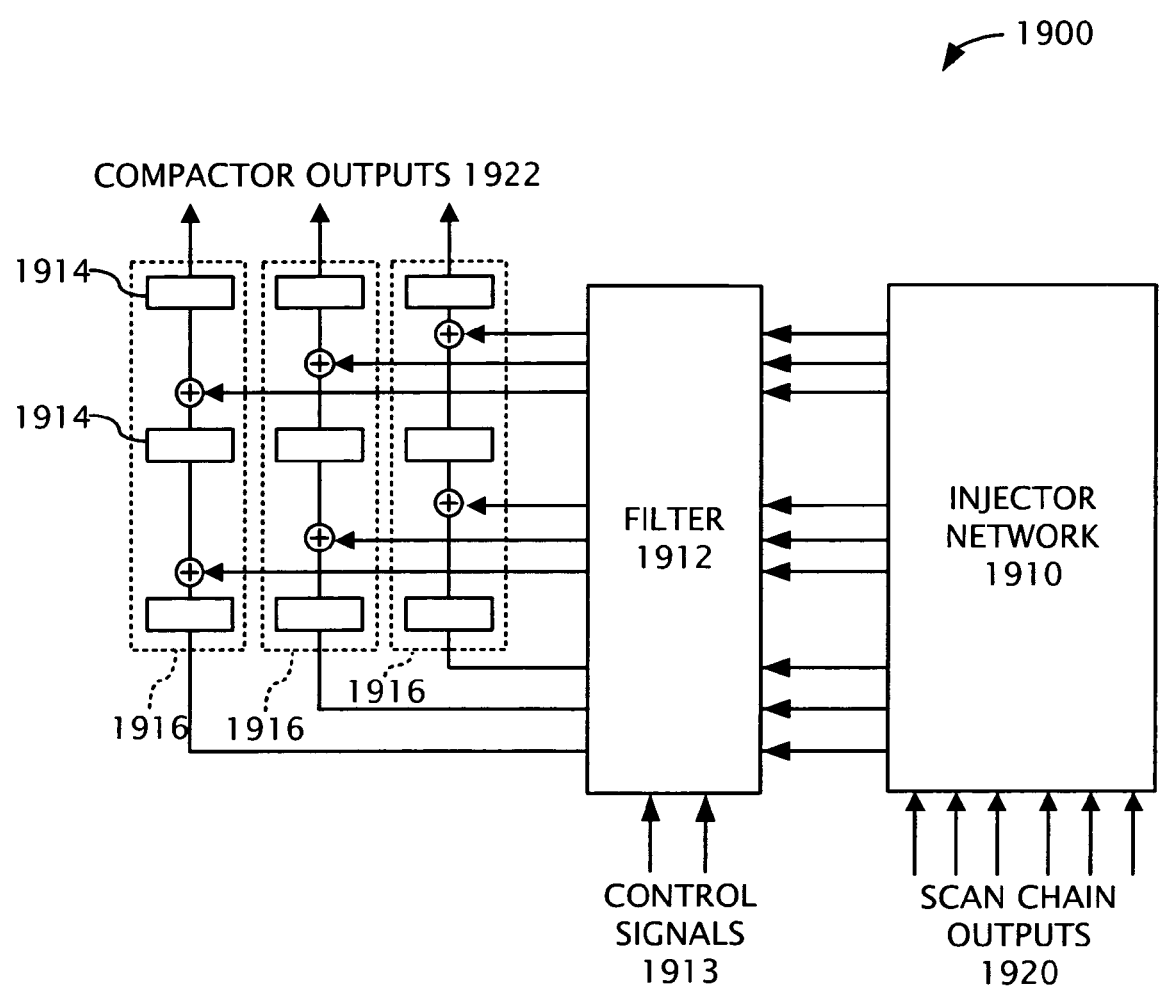
FIG. 19 is a schematic block diagram illustrating a first exemplary configuration of an embodiment of the disclosed filtering hardware implemented in conjunction with a finite memory compactor.

Further, the disclosed technology can be used in conjunction with a wide variety of compactors. For example, embodiments of the disclosed filtering embodiments can be used with finite memory compactors (such as so-called "convolutional compactors") to remove the impact of unknown values and to achieve a very high compaction ratio. Examples of convolutional compactors are described, for instance, in U.S. Patent Published Patent Application No. US 2004/0230884 entitled "Compressing Test Responses Using a Compactor," which is hereby incorporated herein by reference. For instance, one exemplary embodiment 1900 using a convolutional compactor is shown in FIG. 19. In FIG. 19, the convolutional compactor comprises an injector network 1910 configured to receive test responses from scan chain outputs 1920. The injector network 1910 can comprise, for example, a network of XOR gates as described in U.S. Patent Published Patent Application No. US 2004/0230884 and can be characterized as a type of spatial compactor. In alternative embodiments, the injector network 1910 comprises other types of spatial compactors (such as one or more XOR trees). In the illustrated embodiment, the injector network 1910 outputs values to a filter 1912, such as any of the X-filter embodiments described herein. As explained above, the filter 1912 can be configured to remove the effects of one or more unknown values on the values produced by the injector network 1910. Furthermore, in the illustrated embodiment, the filter 1912 is controlled by one or more control signals 1913, as in any of the above-described embodiments. The filter 1912 outputs filtered values to memory elements 1914 of one or more registers 1916. The registers 1916 can therefore operate to output compacted and filtered test response vectors at compactor outputs 1922 when one or more unknown states are present in the test responses received from the scan chain outputs 1920.

Figure 20:
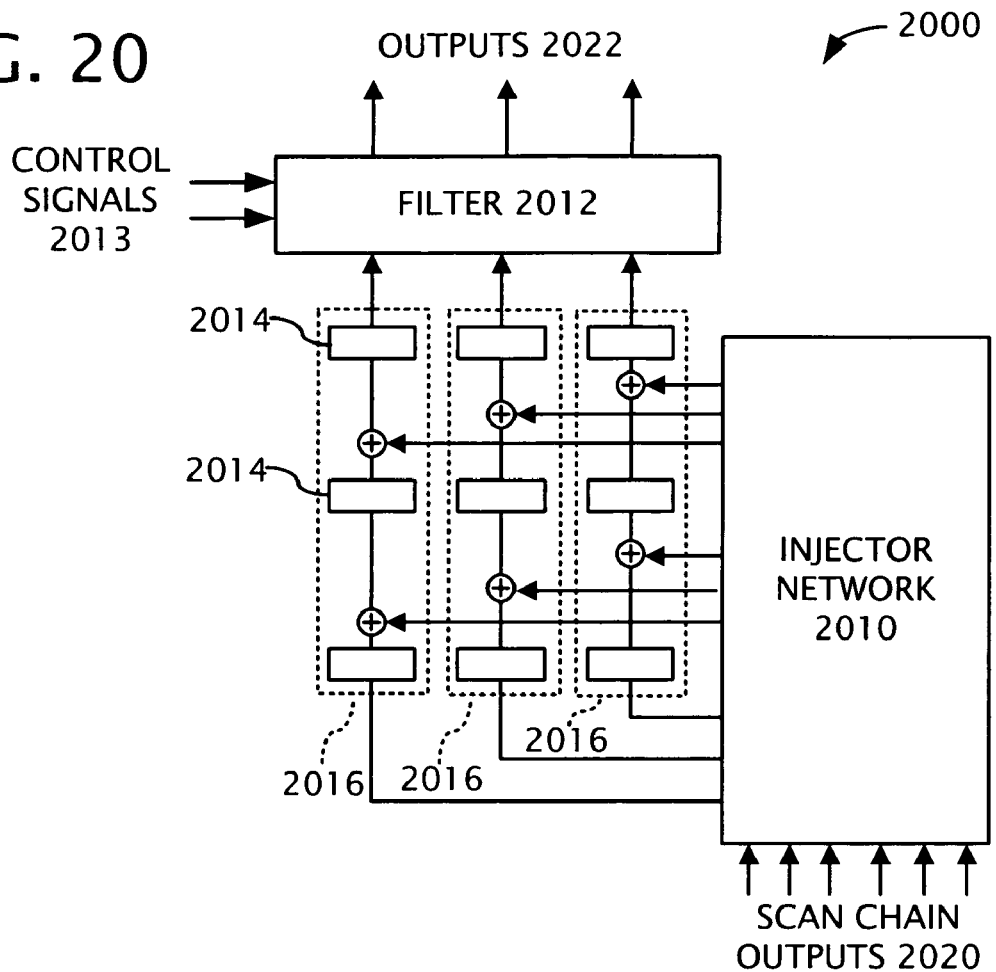
FIG. 20 is a schematic block diagram illustrating a second exemplary configuration of an embodiment of the disclosed filtering hardware implemented in conjunction with a finite memory compactor.

FIG. 20 shows another convolutional compactor embodiment 2000, wherein an injector network 2010 is configured to receive test responses from scan chain outputs 2020. The injector network 2010 of this embodiment is coupled directly to the memory elements 2014 of the one or more registers 2016. According to this embodiment, the output of the registers 2016 is input into a filter 2012, such as any of the X-filter embodiments described herein. As explained above, the filter 2012 can be configured to remove the effects of one or more unknown values on the values output from the registers 2016. Furthermore, in the illustrated embodiment, the filter 2012 is controlled by one or more control signals 2013, as in any of the above-described embodiments. The filter 2012 can thus operate to output compacted and filtered test response vectors at outputs 2022 when one or more unknown states are present in the test responses received from the scan chain outputs 2020.

Figure 21:
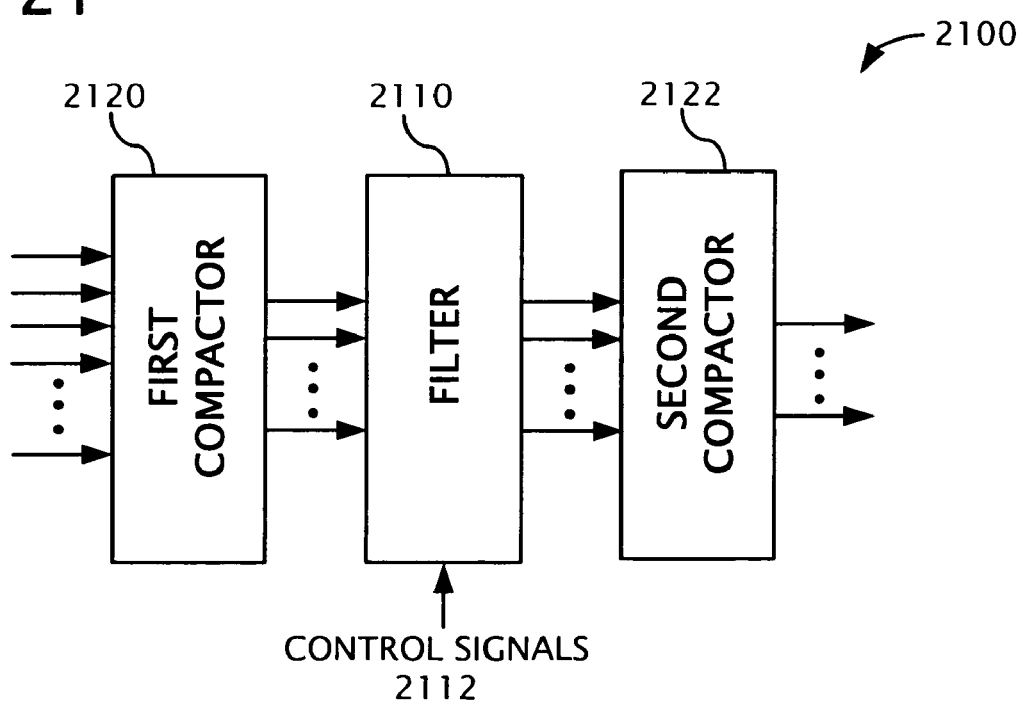
FIG. 21 is a schematic block diagram illustrating an exemplary configuration of an embodiment of the disclosed filtering hardware coupled between two compactors or compactor portions.

In general, the disclosed filtering embodiments can also be used with various combinations of compactors or compactor portions. For example, FIG. 21 is a schematic diagram 2100 showing one such general configuration. Although only two compactors are shown in FIG. 21, multiple additional compactors or compactor portions can also be utilized. In FIG. 21, a filter 2110 (such as any of the X-filtering embodiments described herein) is coupled between a first compactor 2120 and a second compactor 2122. The first compactor 2120 comprises one or more compactors or compactor portions (such as one or more spatial compactors, time compactors, finite memory compactors, or portions thereof), and the second compactor 2122 also comprises one or more compactors or compactor portions (such as one or more spatial compactors, time compactors, finite memory compactors, or portions thereof). In a particular embodiment, the first compactor 2120 is a spatial compactor (for example, a spatial compactor implemented according to an error correcting code) and the second compactor 2122 comprises one or more memory elements and may include a feedback loop implemented according to a feedback polynomial, thereby forming a linear-finite-state-machine-based compactor. In the illustrated embodiment, the filter 2110 can be controlled by one or more control signals 2112 as described above to remove the effects of one or more unknown values on the values output from the first compactor 2120. In certain embodiments of the illustrated configuration or of any configuration described herein, one or more memory elements can be interposed between the filter and the compactor from which the filter receives compacted test responses (for example, for pipelining purposes).

In view of the many possible embodiments, it will be recognized that the illustrated embodiments include only examples and should not be taken as a limitation on the scope of the disclosed technology. Rather, the disclosed technology includes all novel and nonobvious features, aspects, and equivalents thereof of the various disclosed apparatus, methods, and systems, alone and in various combinations and subcombinations with one another. The scope of the disclosed technology is further defined by the following claims. We therefore claim as our invention all that comes within the scope and spirit of these claims.

We claim:

1. A method of testing an integrated circuit, comprising:
   receiving a plurality of compacted test response vectors from a compactor of a circuit-under-test, one or more of the compacted test response vectors having respective compacted test response values that are dependent on one or more respective unknown values;
   filtering at least one of the compacted test response vectors to remove the dependency of the respective compacted test response values on the one or more respective unknown values; and
   outputting at least one filtered test response vector.

2. The method of claim 1, wherein the filtering comprises:
   receiving one or more control values; and
   controlling a network of combinational logic to logically combine at least two of the respective compacted test response values in response to the one or more control values.

3. The method of claim 2, wherein the one or more control values received are compressed control values.

4. The method of claim 1, wherein the at least one filtered test response vector includes at least one respective filtered test response value indicative of an error that was masked by the one or more respective unknown values prior to filtering.

5. The method of claim 1, wherein the acts of receiving, identifying, filtering, and outputting are performed on the integrated circuit.

6. The method of claim 1, wherein the compactor is a first compactor, the method further comprising receiving the one or more filtered test response vectors in a second compactor.

7. An integrated circuit comprising filtering hardware configured to perform the method of claim 1.

8. A method of testing an integrated circuit, comprising:
   outputting compressed test patterns to respective test input pins of one or more circuits-under-test; and
   outputting control signals to respective control pins of the one or more circuits-under-test, the control signals being indicative of bits in one or more compacted test responses that depend from one or more unknown test values.

9. The method of claim 8, further comprising receiving the control signals in filtering hardware on the one or more circuits-under-test, the filtering hardware being configured to logically combine bits in the compacted test response vector in response to the control signals.

10. The method of claim 8, wherein the acts of outputting are performed by coupling the respective test input pins and the respective control pins of multiple circuits-under-test in parallel to output pins of a single external tester.

11. The method of claim 8, wherein the control signals are compressed control signals.

12. The method of claim 11, further comprising decompressing the compressed control signals using one or more decompressors that are part of the one or more circuits-under-test.

13. The method of claim 12, further comprising decompressing the compressed test vectors using the one or more decompressors.

14. One or more tangible computer-readable media storing the control signals used in the method of claim 8.

15. An apparatus used in testing a circuit-under-test, comprising:
   a compactor configured to receive test response vectors output from scan chains in the circuit-under-test; and a logic network coupled to the compactor and configured to receive the compacted test response vectors output from the compactor, the logic network being controllable by one or more control signals and configured to logically combine selected test values of the compacted test response vectors in response to the control signals.

16. The apparatus of claim 15, wherein the compactor is a spatial compactor.

17. The apparatus of claim 15, wherein the compactor is configured at least in part according to an error correcting code.

18. The apparatus of claim 17, wherein the error correcting code used is a code with a minimum Hamming distance d, and wherein the logic network is capable of removing the contributions of up to x unknowns to the compacted test response vector, where x is greater than zero and less than d.

19. The apparatus of claim 18, wherein the logic network produces a filtered output vector that is indicative of up to e errors, where $e+x<d$.

20. The apparatus of claim 18, wherein the logic network produces a filtered output vector that is indicative of the source of up to t errors, where $2t+x<d$.

21. The apparatus of claim 15, wherein the compactor is a first compactor or compactor portion, the apparatus further comprising a second compactor or compactor portion coupled to the logic network and configured to receive filtered test response vectors output from the logic network.

22. The apparatus of claim 21, wherein the second compactor or compactor portion comprises one or more memory elements.

23. The apparatus of claim 15, wherein the logic network comprises two or more cells of hardware having the same logic components as one another.

24. The apparatus of claim 15, wherein the control signals are capable of indicating a linear dependency of a first bit in a respective compacted test response vector on a second bit in the respective compacted test response vector.

25. A circuit, comprising:
a circuit-under-test that is part of the circuit;
a compactor coupled to the circuit-under-test and configured to compact test responses from the circuit-under-test; and
a filter that removes the effects of one or more unknown test values in the test responses compacted by the compactor, the filter being coupled to outputs of the compactor.

26. The circuit of claim 25, wherein the compactor is one of a spatial compactor, a finite memory compactor, or a time compactor.

27. The circuit of claim 25, wherein the filter comprises a logic network configured to combine selected test values of the compacted test responses in response to control signals, and wherein the circuit further comprises one or more control pins coupled to receive the control signals.

28. The circuit of claim 27, wherein the control signals received at the control pins are in a compressed form, the circuit further comprising a decompressor coupled between the control pins and the filter, the decompressor being configured to receive and decompress the control signals.

29. The circuit of claim 25, further comprising a bypass network coupled between the compactor and the filter, the bypass network being configured to receive compacted test response values from the compactor and to selectively output one or more of the compacted test response values so that they bypass the filter.

30. The circuit of claim 25, wherein the compactor is a first compactor, the circuit further comprising a second compactor coupled to the filter and configured to receive a filtered test response vector output from the filter.

31. An electronic device comprising an integrated circuit with on-chip testing hardware operable to compact a circuit response to a test pattern and to optionally combine two or more values of the compacted circuit response through one or more logic gates.

32. The device of claim 31, wherein the on-chip testing hardware operates in response to one or more control signals.

33. The device of claim 32, wherein at least some of the control signals are indicative of whether to combine any values of the compacted circuit response through the one or more logic gates.

34. The device of claim 32, wherein at least some of the control signals are indicative of which values of the compacted circuit response to combine through the one or more logic gates.

* * * * *